(12) United States Patent
Deguenther et al.

(10) Patent No.: US 8,416,390 B2
(45) Date of Patent: Apr. 9, 2013

(54) ILLUMINATION SYSTEM FOR ILLUMINATING A MASK IN A MICROLITHOGRAPHIC EXPOSURE APPARATUS

(75) Inventors: Markus Deguenther, Aalen (DE); Paul Graeupner, Aalen (DE); Juergen Fischer, Heidenheim (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 742 days.

(21) Appl. No.: 12/533,756

(22) Filed: Jul. 31, 2009

(65) Prior Publication Data

US 2010/0060873 A1    Mar. 11, 2010

Related U.S. Application Data

(60) Provisional application No. 60/913,962, filed on Apr. 25, 2007, provisional application No. 60/913,956, filed on Apr. 25, 2007.

(51) Int. Cl.
*G03B 27/54* (2006.01)
*G03B 27/42* (2006.01)

(52) U.S. Cl.
USPC .............................................. 355/67; 355/53

(58) Field of Classification Search ............ 355/67, 355/53
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,523,193 A | 6/1996 | Nelson | |
| 6,285,488 B1 | 9/2001 | Sandstrom | |
| 6,515,257 B1 | 2/2003 | Jain et al. | |
| 6,707,595 B2 | 3/2004 | Kutz et al. | |
| 6,816,302 B2 | 11/2004 | Sandstrom et al. | |
| 6,877,882 B1 | 4/2005 | Haven et al. | |
| 6,899,435 B2 | 5/2005 | Yamanaka | |
| 6,899,436 B2 | 5/2005 | Slobodin | |
| 6,965,119 B2 | 11/2005 | Sandström et al. | |

(Continued)

FOREIGN PATENT DOCUMENTS

| DE | 10200244 A1 | 7/2003 |
|---|---|---|
| EP | 916984 A1 | 5/1999 |

(Continued)

OTHER PUBLICATIONS

Hecht, 4ed Optics, Chapter 5, Optics, pp. 149-150, Copyright Pearson Education, Inc., 2002.

*Primary Examiner* — Peter B Kim

(74) *Attorney, Agent, or Firm* — Fish & Richardson P.C.

(57) ABSTRACT

An illumination system for illuminating a mask in a microlithographic exposure apparatus has an optical axis and a pupil surface. The system can include an array of reflective or transparent beam deflection elements such as mirrors. Each deflection element can be adapted to deflect an impinging light ray by a deflection angle that is variable in response to a control signal. The beam deflection elements can be arranged in a first plane. The system can further include an optical raster element, which includes a plurality of microlenses and/ or diffractive structures. The beam deflection elements), which can be arranged in a first plane, and the optical raster element, which can be arranged in a second plane, can commonly produce a two-dimensional far field intensity distribution. An optical imaging system can optically conjugate the first plane to the second plane.

31 Claims, 20 Drawing Sheets

U.S. PATENT DOCUMENTS

| | | |
|---|---|---|
| 7,038,762 B2 | 5/2006 | Boettiger et al. |
| 7,053,987 B2 | 5/2006 | Mackey et al. |
| 7,061,582 B2 | 6/2006 | Zinn et al. |
| 2002/0136351 A1 | 9/2002 | Singer |
| 2003/0227606 A1 | 12/2003 | Sweatt |
| 2004/0053148 A1* | 3/2004 | Morohoshi ............ 430/30 |
| 2005/0270512 A1 | 12/2005 | De Jager |
| 2006/0017902 A1 | 1/2006 | Rhyzhikov et al. |
| 2006/0087634 A1 | 4/2006 | Brown et al. |
| 2006/0176452 A1 | 8/2006 | Kim et al. |

FOREIGN PATENT DOCUMENTS

| | | |
|---|---|---|
| EP | 1 262 836 | 12/2002 |
| EP | 1 367 446 | 12/2003 |
| JP | 11 003849 | 1/1999 |
| WO | WO03040796 A1 | 5/2003 |
| WO | WO03067288 A1 | 8/2003 |
| WO | WO 2005/026843 | 3/2005 |
| WO | WO 2005/096098 | 10/2005 |
| WO | WO2008061681 A3 | 7/2008 |

* cited by examiner

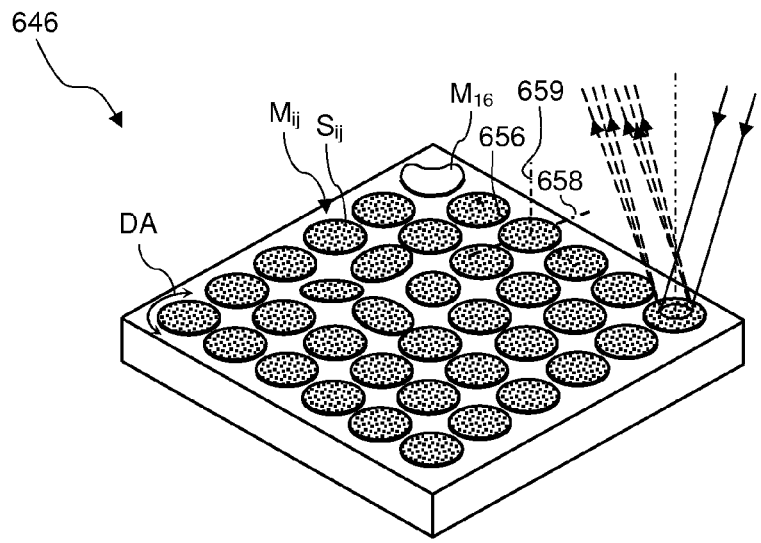
FIG. 23
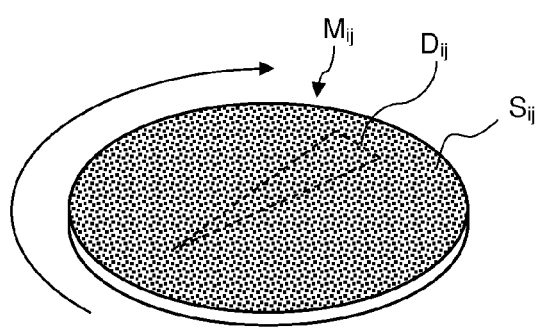 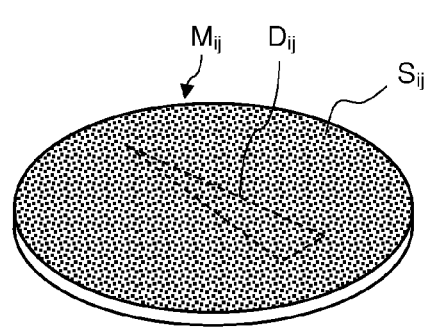
FIG. 24a　　　　FIG. 24b

ILLUMINATION SYSTEM FOR ILLUMINATING A MASK IN A MICROLITHOGRAPHIC EXPOSURE APPARATUS

CROSS-REFERENCE TO RELATED APPLICATIONS

This application is a continuation of, and claims priority under 35 U.S.C. 120 to, international application PCT/EP2008/003369, filed Apr. 25, 2008, which claims benefit under 35 U.S.C 119(e)(1) of U.S. provisional applications Nos. 60/913,962 and 60/913,956, both filed on Apr. 25, 2007. The contents of each of these applications is incorporated herein in their entirety.

FIELD

The disclosure generally relates to an illumination system for illuminating a mask in a microlithographic exposure apparatus, including an illumination system that includes an array of reflecting elements, which may be realized as a microelectromechanical system (MEMS), such as a digital micromirror device (DMD).

BACKGROUND

Microlithography (also called photolithography or simply lithography) is a technology for the fabrication of integrated circuits, liquid crystal displays and other microstructured devices. More particularly, the process of microlithography, in conjunction with the process of etching, is commonly used to pattern features in thin film stacks that have been formed on a substrate, for example a silicon wafer. At each layer of the fabrication, the wafer is typically first coated with a photoresist which is a material that is sensitive to radiation, such as deep ultraviolet (DUV) light. Next, the wafer with the photoresist on top is usually exposed to projection light in a projection exposure apparatus. The apparatus projects a mask containing a pattern onto the photoresist so that the latter is only exposed at certain locations which are determined by the mask pattern. After the exposure the photoresist can be developed to produce an image corresponding to the mask pattern. Then an etch process can be used to transfer the pattern into the thin film stacks on the wafer. Finally, the photoresist is usually removed. Repetition of this process with different masks can result in a multi-layered microstructured component.

A projection exposure apparatus typically includes an illumination system for illuminating the mask, a mask stage for aligning the mask, a projection objective and a wafer alignment stage for aligning the wafer coated with the photoresist. The illumination system illuminates a field on the mask that may have the shape of an elongated rectangular slit, for example.

There are two types of commonly used projection exposure apparatus. In one type each target portion on the wafer is irradiated by exposing the entire mask pattern onto the target portion in one go; such an apparatus is commonly referred to as a wafer stepper. In the other type of apparatus, which is commonly referred to as a step-and-scan apparatus or scanner, each target portion is irradiated by progressively scanning the mask pattern under the projection beam in a given reference direction while synchronously scanning the wafer stage parallel or anti-parallel to this direction. The ratio of the velocity of the wafer and the velocity of the mask is equal to the magnification of the projection objective, which is usually smaller than 1, for example 1:4.

It is to be understood that the term "mask" (or reticle) is to be interpreted broadly as a patterning device. Commonly used masks contain transmissive or reflective patterns and may be of the binary, alternating phase-shift, attenuated phase-shift or various hybrid mask type, for example. However, there are also active masks, for example masks realized as a programmable mirror array. An example of such a device is a matrix-addressable surface having a viscoelastic control layer and a reflective surface. Also programmable LCD arrays may be used as active masks. For the sake of simplicity, the remainder of the disclosure is provided in the context of apparatus that include a mask and a mask stage, but the general principles discussed in such apparatus are to be understood in the broader context of the patterning devices noted above.

In some cases, it can be desirable for the illumination system to illuminate each point of the illuminated field on the mask with projection light having a well defined irradiance and angular distribution. The term angular distribution describes how the total light energy of a light bundle, which converges towards a particular point in the mask plane, is distributed among the various directions along which the rays constituting the light bundle propagate. The angular distribution of the projection light impinging on the mask is usually adapted to the kind of pattern to be projected onto the photoresist. For example, relatively large sized features may involve a different angular distribution than small sized features. The most commonly used angular distributions of projection light are referred to as conventional, annular, dipole and quadrupole illumination settings. These terms refer to the irradiance distribution in a pupil surface of the illumination system. With an annular illumination setting, for example, only an annular region is illuminated in the pupil surface. Thus there is only a small range of angles present in the angular distribution of the projection light, and thus all light rays impinge obliquely with similar angles onto the mask.

Different approaches are known for modifying the angular distribution of the projection light in the mask plane so as to achieve the desired illumination setting. In a relatively simple case a stop (diaphragm) which includes one or more apertures is positioned in a pupil surface of the illumination system. Because locations in a pupil surface translate into angles in a Fourier related field plane such as the mask plane, the size, shape and location of the aperture(s) in the pupil surface help determine the angular distributions in the mask plane. However, in general, any change of the illumination setting involves a replacement of the stop. This can make it difficult to finally adjust the illumination setting, because this could involve a very large number of stops that have aperture(s) with slightly different sizes, shapes or locations.

Many common illumination systems include adjustable elements that make it possible, at least to a certain extent, to continuously vary the illumination of the pupil surface. Conventionally, a zoom axicon system including a zoom objective and a pair of axicon elements are used for this purpose. An axicon element is a refractive lens that has a conical surface on one side and is usually plane on the opposite side. By providing a pair of such elements, one having a convex conical surface and the other a complementary concave conical surface, it can be possible to radially shift light energy. The shift can be a function of the distance between the axicon elements. The zoom objective can help make it possible to alter the size of the illuminated area in the pupil surface.

SUMMARY

In some embodiments, the disclosure provides an illumination system for illuminating a mask in a microlithographic projection exposure apparatus, in which the illumination system includes an array of reflective elements (or a device having a similar effect), which has relatively good variability while using comparatively few reflective elements.

In certain embodiments, the disclosure provides an illumination system that has an optical axis and a pupil surface. The illumination system includes an array of reflective or transparent beam deflection elements. Each deflection element of the array is adapted to deflect an impinging light ray by a deflection angle that is variable in response to a control signal. The deflection elements are arranged in a first plane. The illumination system further includes an optical raster element which includes a plurality of microlenses and/or diffractive structures and is arranged in a second plane. The beam deflection array and the optical raster element are configured to commonly produce a two-dimensional intensity distribution in the pupil surface. In addition, the illumination systems includes an optical imaging system that optically conjugates the first plane to the second plane.

As a result of the conjugation between the first plane and the second plane, the two-dimensional intensity distribution in the pupil surface can be a convolution of the far field intensity distribution produced by the beam deflection array and the far field intensity distribution produced by the optical raster element. However, in contrast to certain known illumination systems, an illumination system as described herein can ensure an unambiguous one-to-one relationship between locations on the beam deflection array on the one hand and locations on the optical raster element on the other hand.

For example, if it is assumed that the second plane is an object plane and the first plane is an image plane of the optical imaging system, this implies that all light rays impinging on a particular location on the optical raster element also impinge on the same location on a particular deflection element of the beam deflection array. This makes it possible to design a location on the optical raster element, which corresponds to a location on a particular deflection element, such that it is ideally adapted to this particular deflection element. Such adaptations may relate to the amount of light which is allowed to reach the particular deflection element, or to its state of polarization if the optical raster element has a polarizing effect.

A particularly advantageous effect of the optical conjugation is that the optical raster element may include a plurality of zones, wherein each zone is, by optical conjugation produced by the optical imaging system, associated to at least one deflection element of the beam deflection array. At least two zones may produce different far field intensity distributions. If it is again assumed that the beam deflection array is arranged between the optical raster element and the pupil surface, this implies that different deflection elements produce different far field intensity distributions which are determined by the associated zones. By changing the deflection angle of the deflection elements in response to a control signal, it is then possible to move this far field intensity distribution across the pupil surface.

Different far field intensity distributions produced by the optical raster element may then be combined in different configurations in the pupil surface so that a large variety of different configurations can be produced. By suitably selecting the different far field intensity distributions produced by the zones of the optical raster element, a very large variety of different intensity distributions in the pupil surface may be produced with a very small number of deflection elements, for example with less than 100, such as less than 50 elements.

The same also applies if the optical raster element is arranged between the beam deflection array and the pupil surface. In this case the first plane is an object plane and the second plane is an image plane of the optical imaging system. The zones of the optical raster element are only illuminated by the or those deflection elements that are arranged in an area which is optically conjugated to the area of the zone. By changing the reflection angle of a particular deflection element it is possible to change the direction of the light rays which impinge on the associated zone. The total angular distribution produced by the combination of the particular zone and the associated deflection element(s) can again be described as a convolution of far field intensity distribution produced by the zone and far field intensity distribution produced by the deflection element.

If a plurality of deflection elements illuminates a single zone, which produces a specific angular distribution, a plurality of identical far field intensity distributions can be freely arranged in the pupil surface simply by changing the deflection angle of the deflection elements under consideration.

Each or some deflection elements may be adapted to be either in an "on" state or in an "off" state. In the "on" state, a deflected light beam passes the pupil surface at a predetermined location. In the "off" state, a deflected light ray does not pass the pupil surface. Such a digital reflective array usually has a simpler mechanical construction.

If more than one deflection element is associated with a single zone producing a particular far field intensity distribution, such a digital beam deflection array can still make it possible to modify the total intensity of this distribution. The total intensity in the far field produced by the zone may then be modified by simply switching on or off the desired number of deflection elements that are associated with the respective zone.

The beam deflection elements may be configured as mirrors which can be tilted by two tilt axes forming an angle therebetween. In some embodiments, the beam deflection elements are transparent electro-optical or acousto-optical elements.

In certain embodiments, the disclosure provides an illumination system for illuminating a mask in a microlithographic exposure apparatus that includes an array of reflective or transparent beam deflection elements. Each beam deflection element is adapted to deflect an impinging light ray by a deflection angle that is variable in response to a control signal. At least one deflection element is curved in a rotationally asymmetric manner and/or supports a diffractive structure producing a rotationally asymmetric far field intensity distribution. At least one beam deflection element is mounted such that it has three rotational degrees of freedom.

In addition to two usually orthogonal tilt axes it is possible to rotate the beam deflection element by a rotational axis that can extend at least substantially perpendicular to an optical surface of the beam deflection element, for example a mirror surface if the beam deflection elements are mirrors. If the beam deflection elements are electro-optical or acousto-optical elements or other transparent elements, the additional rotational axis may be at least substantially perpendicular to this light exit surface.

BRIEF DESCRIPTION OF THE DRAWINGS

Various features and advantages of the disclosure may be more readily understood with reference to the following detailed description taken in conjunction with the accompanying drawing in which:

FIG. 23 is a perspective view of a mirror array for use in the illumination system shown in FIG. 20 including mirrors that support diffractive structures and have three rotational degrees of freedom;

FIGS. 24a and 24b are perspective views of a single mirror element of the array shown in FIG. 23 in two different rotational positions;

DETAILED DESCRIPTION

1. General Structure of Projection Exposure Apparatus

Figure 1:
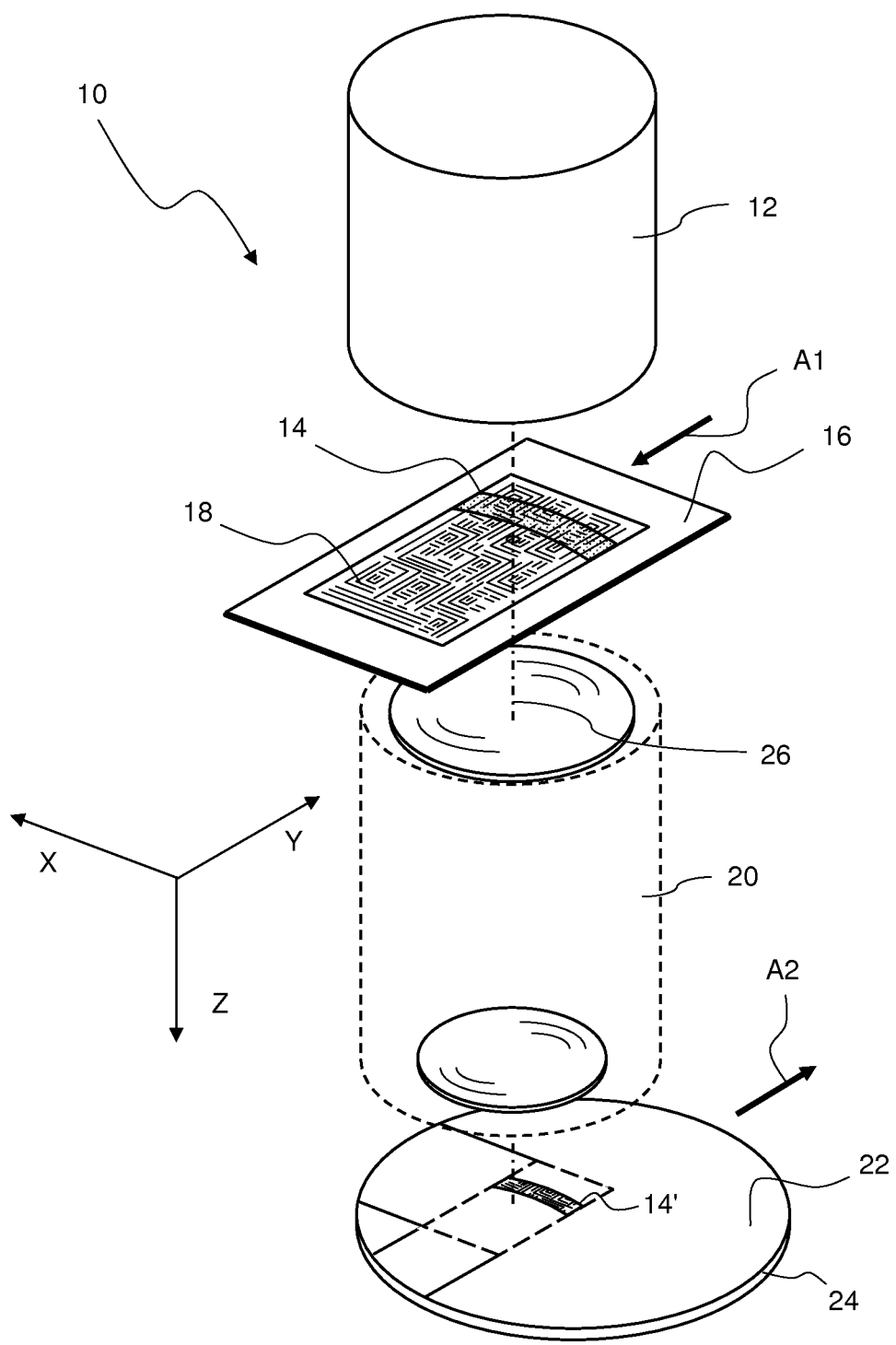
FIG. 1 is a perspective and considerably simplified view of a projection exposure apparatus.

FIG. 1 is a perspective and highly simplified view of a projection exposure apparatus 10 that used in the manufacture of integrated circuits and other microstructured components. The projection exposure apparatus includes an illumination system 12 containing a light source that produces projection light and illumination optics that transforms the projection light into a projection light bundle having carefully defined properties. The projection light bundle illuminates a field 14 on a mask 16 containing minute structures 18. In this embodiment, the illuminated field 14 has approximately the shape of a ring segment. However, other, for example rectangular, shapes of the illuminated field 14 are contemplated as well.

A projection objective 20 images the structures 18 within the illuminated field 14 onto a light sensitive layer 22, for example a photoresist, which is applied on a substrate 24. The substrate 24, which may be formed by a silicon wafer, is arranged on a wafer stage (not shown) such that a top surface of the light sensitive layer 22 is precisely located in the image plane of the projection objective 20. The mask 16 is positioned by a mask stage (not shown) in an object plane of the projection objective 20. Since the projection objective 20 has a magnification of less than 1, for example 1:4, a reduced image 14' of the structures 18 within the illuminated field 14 is formed on the light sensitive layer 22.

2. General Structure of Illumination System

Figure 2:
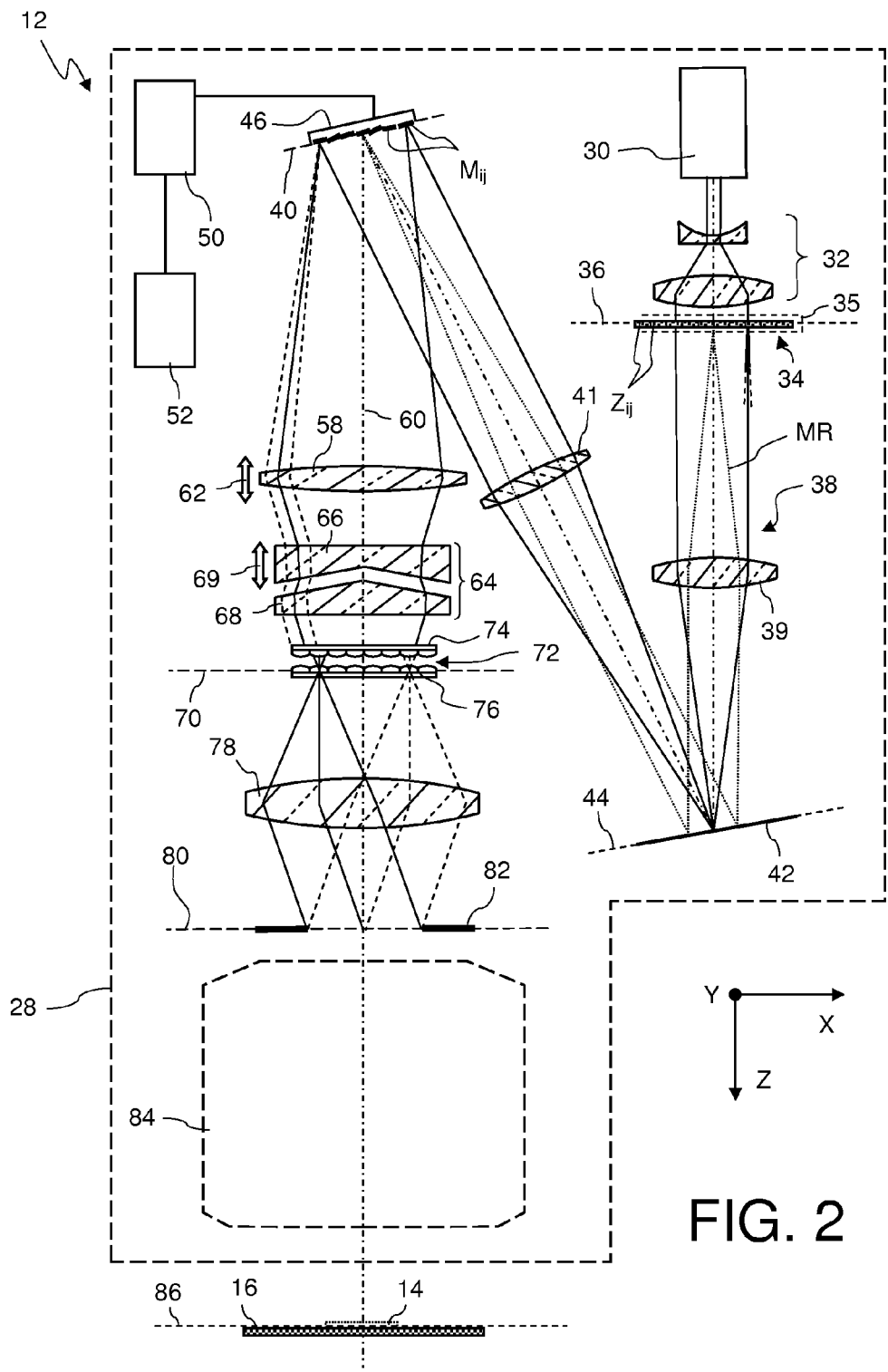
FIG. 2 is a meridional section through an illumination system contained in the projection exposure apparatus shown in FIG. 1.

FIG. 2 is a more detailed meridional section through a first embodiment of the illumination system 12 shown in FIG. 1. For the sake of clarity, the illustration of FIG. 2 is considerably simplified and not to scale. This particularly implies that different optical units are represented by very few optical elements only. In reality, these units may include significantly more lenses and other optical elements.

The illumination system 12 includes a housing 28 and a light source that is, in the embodiment shown, realized as an excimer laser 30. The excimer laser 30 emits projection light that has a wavelength of about 193 nm. Other types of light sources and other wave-lengths, for example 248 nm or 157 nm, are also contemplated.

In the embodiment shown, the projection light emitted by the excimer laser 30 enters a beam expansion unit 32 in which the light bundle is expanded without altering the geometrical optical flux. The beam expansion unit 32 may include several lenses as shown in FIG. 2, or may be realized as a mirror arrangement. After passing through the beam expansion unit 32, the projection light impinges on an optical raster element 34, which is exchangeably received in an exchange holder 35.

As will be described in more detail further below with reference to FIG. 6, the optical raster element 34 includes a plurality of adjacent zones $Z_{ij}$ that form, in the embodiment shown, a regular grid-like array in a plane in which the optical raster element 34 extends. Each zone $Z_{ij}$ contains a diffractive optical element which produces a carefully designed intensity distribution in the far field. In the far field the distance, at which an intensity distribution produced by a diffractive optical element is observed, is large in comparison to the typical width of the diffractive structures contained in the element. In this case the far field intensity distribution is given by the Fourier transform of the amplitude function which describes the geometry of the diffracting structures. For that reason it is possible to design almost for any arbitrary desired far field intensity distribution with the help of a suitable diffractive optical element. The diffractive optical element has an amplitude function which is given by the inverse Fourier transform of the desired far field intensity distribution. Diffractive optical elements of this kind are often referred to as "computer generated holograms" (CGH) and are readily available from various suppliers of optical technology.

Alternatively, the zones $Z_{ij}$ of the optical raster element 34 may contain a plurality of microlenses, for example spherical, aspherical, cylindrical or prismatic microlenses. Spherical and cylindrical microlenses produce, for example, far field intensity distributions having the geometry of a circular disc or a rectangular strip, respectively.

The plane in which the optical raster element 34 extends is an object plane 36 of an optical imaging system 38 which is represented, in the simplified illustration of FIG. 2, by two positive lenses 39 and 41. The optical imaging system 38 images the object plane 36 to an image plane 40, thereby achieving an optical conjugation between the object plane 36 and the image plane 40. Thus each light bundle diverging from a particular object point in the object plane 36 converges to an associated image point in the image plane 40. In FIG. 2 this is indicated by dotted lines MR that represent marginal rays of a light bundle that emerges from an on-axis point in the object plane 36.

In this specific embodiment the optical imaging system 38 contains a plane folding mirror 42 which reduces the overall length of the illumination system 12. The folding mirror 42 is arranged in a pupil plane 44 so that the far field distributions produced by the zones $Z_{ij}$ of the optical raster element 34 are formed on the folding mirror 42. However, the folding mirror 42 may be completely dispensed with, or it may also be arranged outside the pupil plane of the optical imaging system 38.

In the image plane 40 of the optical imaging system 38 a mirror array 46 is arranged. As will be explained in more detail below, the mirror array 46 includes a plurality of small individual mirror elements $M_{ij}$ that can be tilted, independently from each other, by two tilt axes that can be aligned perpendicularly to each other. The total number of mirror elements $M_{ij}$ can be less than 100, such as less than 50. The reflecting surfaces of the mirror elements $M_{ij}$ may be plane, but could also be curved along at least one direction if an additional reflective power is desired. For example, the mirror elements $M_{ij}$ may be configured as convex or concave cylinder mirrors if the curvature is restricted to only one direction. If the mirrors $M_{ij}$ are curved along two directions, the curvature may be rotationally symmetrical or non-symmetrical. In the latter case the mirrors $M_{ij}$ may have an anamorphic reflective power. It can be particularly advantageous if the curvature of the mirror elements $M_{ij}$ can be modified using appropriate actuators.

The tilting movements of the individual mirror elements $M_{ij}$ are controlled by a mirror control unit 50 which is connected to an overall system control 52 of the illumination system 12. Actuators that are used to set the desired tilt angles of the mirror elements $M_{ij}$ receive control signals from the mirror control unit 50 such that each individual mirror element $M_{ij}$ is capable of reflecting an impinging light ray by a reflection angle that is variable in response to the control signal. In the embodiment shown there is a continuous range of tilt angles, and therefore reflection angles, at which the individual mirror elements $M_{ij}$ can be arranged. In some embodiments, the actuators are configured such that only a limited number of discrete tilting angles can be set. An embodiment with only two different tilting angles will be described further below.

Figure 3:
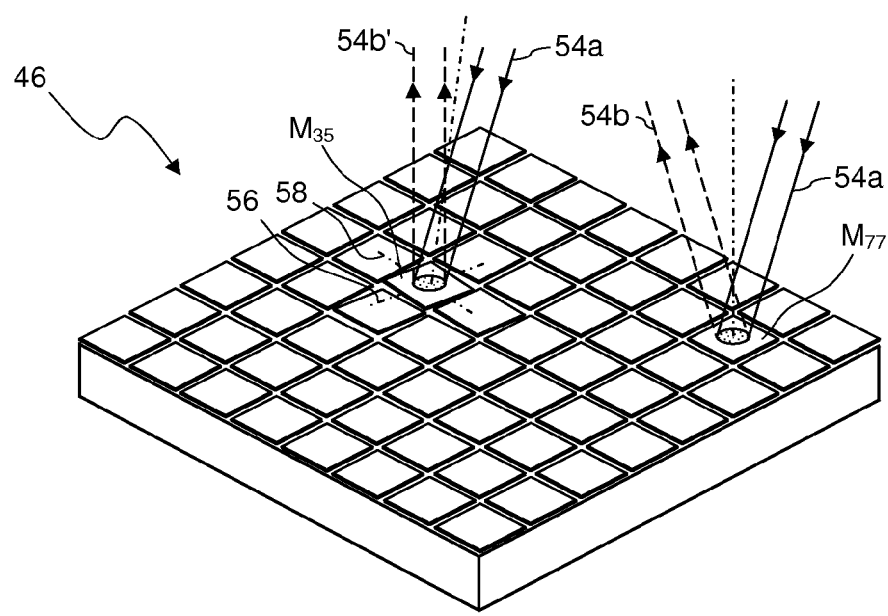
FIG. 3 is a perspective view of a mirror array contained in the illumination system of FIG. 2.

FIG. 3 shows a perspective view of the mirror array 46 including 8×8=64 mirror elements $M_{ij}$. Parallel light bundles 54a impinging on the mirror array 46 are reflected to different directions depending on the tilt angles of the mirror elements $M_{ij}$. In this schematic representation it is assumed that a particular mirror element $M_{35}$ is tilted about two tilt axes 56, 58 relative to another mirror element $M_{77}$ so that the light bundles 54b, 54b' which are reflected by the mirror elements $M_{35}$ and $M_{77}$, respectively, are reflected into different directions.

Figure 4:
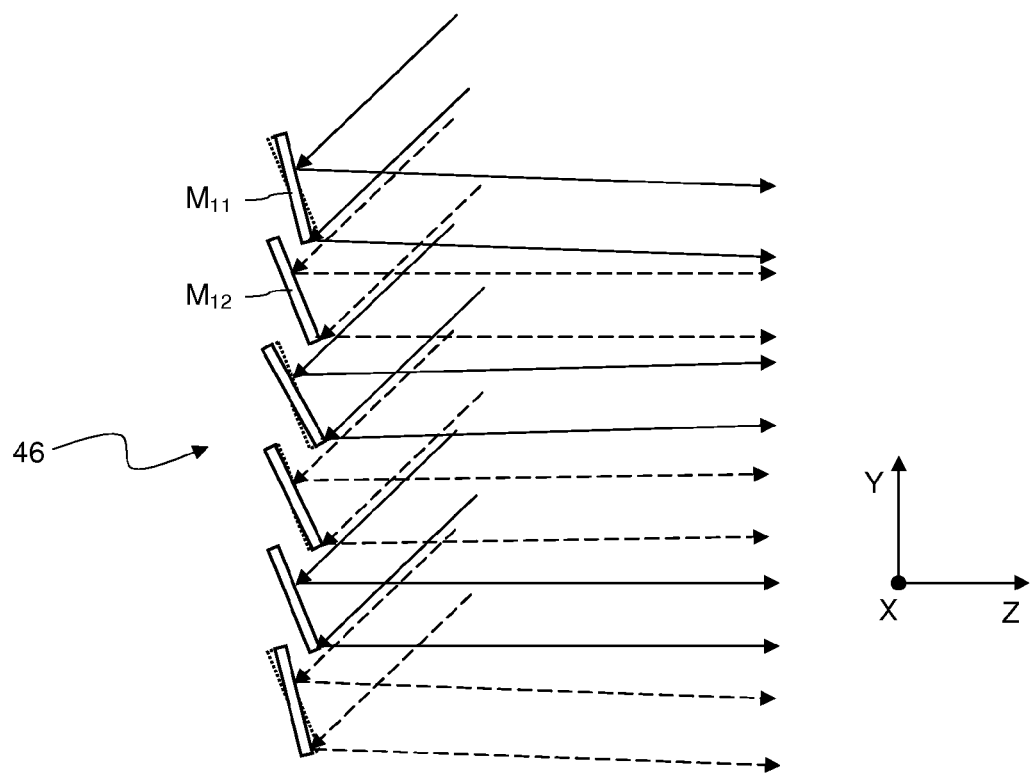
FIG. 4 is a cross-section through the mirror array of FIG. 3.

The cross section of FIG. 4 illustrates how, in a YZ plane, parallel light may be reflected into different directions by a plurality of adjacent mirror elements $M_{ij}$ that are tilted by various tilt angles in the YZ plane.

Referring again to FIG. 2, the illumination system 12 further includes a zoom lens system 58 having a variable focal length. The zoom lens system 58 is represented in FIG. 2 by a single lens which is displaceable along an optical axis of the illumination system 12, as is indicated by double arrow 62.

Behind the zoom lens system 58 a pair 64 of axicon elements 66, 68 having opposing conical surfaces is arranged. If both axicon elements 66, 68 are in immediate contact, the axicon pair 64 has only the effect of a plane parallel plate. If both axicon elements 66, 68 are moved apart, as is indicated in FIG. 2 by a double arrow 69, the spacing between the axicon elements 66, 68 causes a shift of light energy radially outward. Since axicon elements are known as such in the art, these will not be explained here in further detail.

Reference numeral 70 denotes a pupil surface of the illumination system 12 that substantially defines the angular distribution of the light impinging on the mask 14. The pupil surface 70 is usually plane or slightly curved and is arranged in or in immediate vicinity of an optical integrator 72 which produces a plurality of secondary light sources. The optical integrator 72 is realized, in the embodiment shown, as a fly's eye lens including two substrates 74, 76 that each includes two orthogonal arrays of parallel cylindrical microlenses. The optical integrator 72 increases the range of angles formed between the light rays and an optical axis OA of the illumination system 12. As the angular distribution in the pupil surface 70 directly translates into an intensity distribution in a subsequent field plane, the optical integrator 72 substantially determines the geometry of the illuminated field 14 on the mask 16. Since the optical integrator 72 increases the range of angles considerably more in the X direction then in the Y direction, the illuminated field 14 has larger dimensions along the X direction than along the Y direction (i.e. the scan direction).

The projection light emerging from the secondary light sources produced by the optical integrator 72 enters a condenser 78 that is represented in FIG. 2 by a single lens only for the sake of simplicity. The condenser 78 ensures a Fourier relationship between the pupil surface 70 and a subsequent intermediate field plane 80 in which a field stop 82 is arranged. The condenser 78 superimposes the light bundles, which are produced by the secondary light sources, in the intermediate field plane 80, thereby achieving a very homogenous illumination of the intermediate field plane 80. The field stop 82 may include a plurality of movable blades and ensures sharp edges of the illuminated field 14 on the mask 16.

A field stop objective 84 provides optical conjugation between the intermediate field plane 80 and the mask plane 86 in which the mask 16 is arranged. The field stop 82 is thus sharply imaged by the field stop objective 84 onto the mask 16.

3. Function of Illumination System

In the following the general function of the illumination system 12 will be explained with reference to FIGS. 5a to 5c and 6 to 11.

Figure 6:
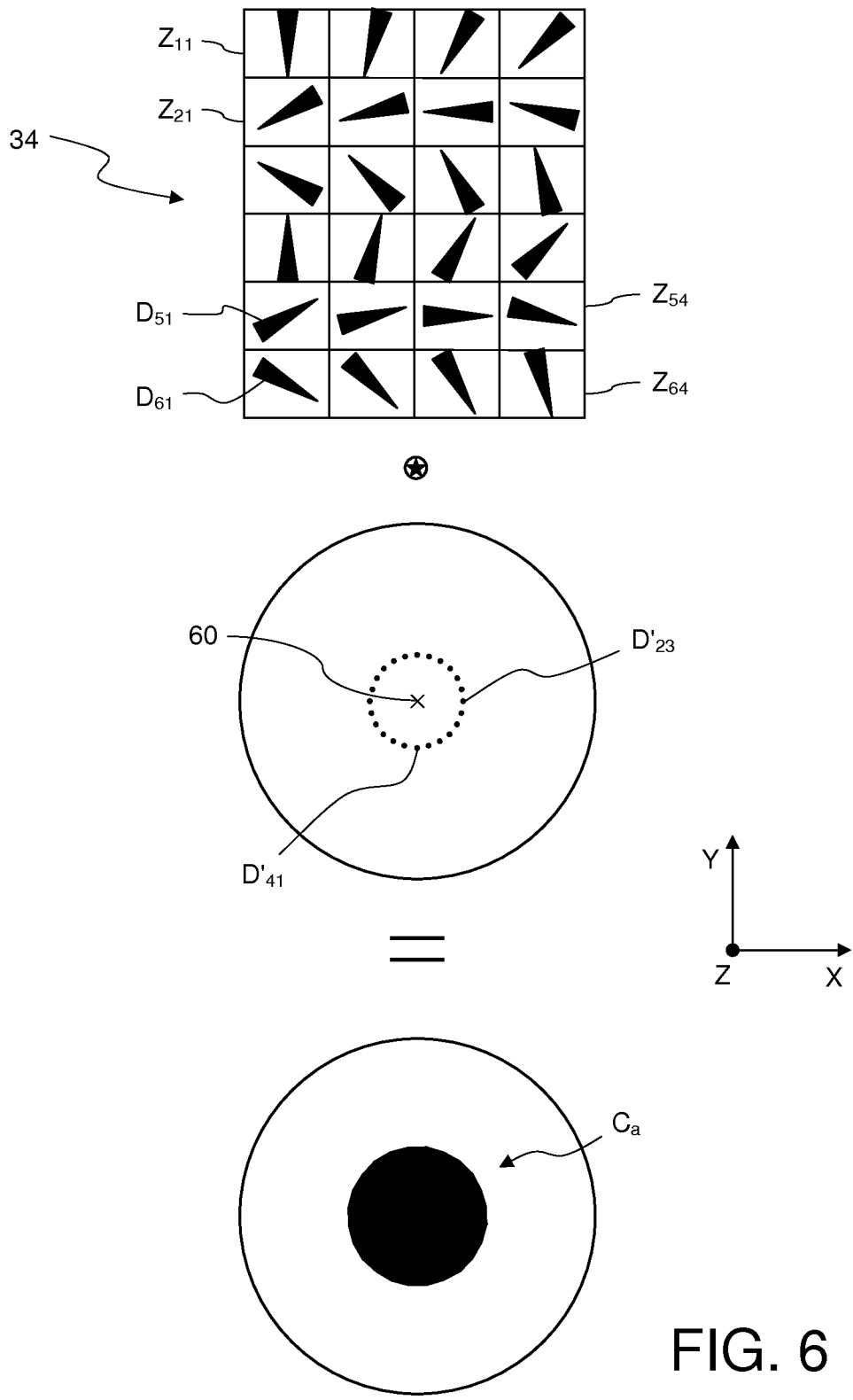
FIGS. 6 to 10 are schematic drawings illustrating the convolution of different far field intensity distributions produced by the optical raster element and different configurations of the mirror array.

FIG. 6 shows in its upper portion a schematic front view of the zones $Z_{ij}$ which are arranged on the optical raster element 34 such that they form a grid-like array. The index i denotes a particular row extending along the X direction, and the index j denotes a particular column of the array extending along the Y direction. In this particular example, it is assumed that the optical raster element 34 includes a totality of 24 zones $Z_{ij}$. It is furthermore assumed that there is the same number and a corresponding arrangement of mirror elements $M_{ij}$ in the mirror array 46 so that each zone $Z_{ij}$ is associated with exactly one mirror element $M_{ij}$ in the mirror array 46. The size and geometry of the zones $Z_{ij}$ is selected such that each zone $Z_{ij}$ is completely, or at least substantially completely, imaged on its associated mirror element $M_{ij}$ in the mirror array 46 by the optical imaging system 38. This means that all light propagating through a particular zone $Z_{ij}$ impinges (only) on the corresponding mirror element $M_{ij}$ in the mirror array 46.

In the representation of the optical raster element 34 in the upper portion of FIG. 6, each zone $Z_{ij}$ contains an isosceles triangle which shall illustrate the far field intensity distribution $D_{ij}$ produced by the respective zone $Z_{ij}$. As can be seen in FIG. 6, all zones $Z_{ij}$ produce far field intensity distributions $D_{ij}$ that have the basic geometry of isosceles triangle, but with different angular orientations. In this embodiment there are 24 different angular orientations, which are separated by regular angles of $360°/24=15°$. The diffractive structures contained in each Zone $Z_{ij}$ are designed such that they produce an angular distribution which translates in the far field to the intensity distributions $D_{ij}$.

As a result of the optical conjugation caused by the optical imaging system 38, these angular distributions are "imaged" on the mirror elements $M_{ij}$ of the mirror array 46. Consequently, each mirror element $M_{ij}$ basically produces the angular distribution, and thus the far field intensity distribution $D_{ij}$, of the associated zone $Z_{ij}$ of the optical raster element 34. However, since the mirror elements $M_{ij}$ can be tilted, an additional offset angle, which depends on the tilt angle of the particular mirror element $M_{ij}$, is superimposed to this angular distribution. In the far field, the additional offset angle produced by tilting a mirror element $M_{ij}$ translates into an additional offset displacement of the respective far field intensity distribution $D_{ij}$ produced by the associated zone $Z_{ij}$. In other words, it is possible to spacially shift the far field intensity distributions $D_{ij}$ by suitably tilting the associated mirror element $M_{ij}$.

Figure 5A:
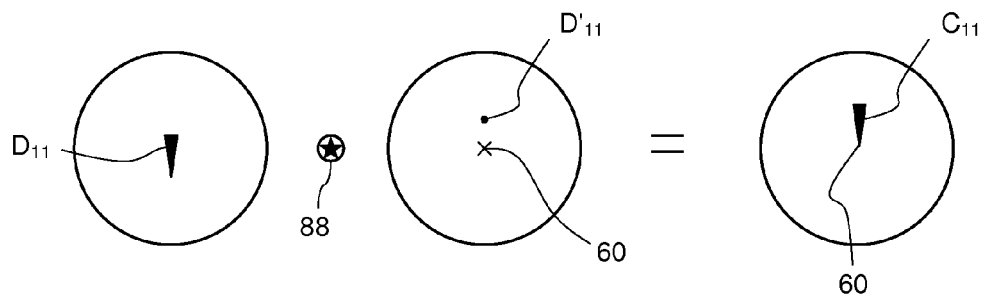
FIGS. 5a to 5c are schematic drawings illustrating the convolution of far field intensity distributions produced by zones of the optical raster element and mirror elements.

Mathematically the far field distribution produced by the combination of a zone $Z_{ij}$ of the optical raster element 34 and an associated mirror element $M_{ij}$ of the mirror array 46 can be described as convolution. In FIG. 5a the left portion illustrates the far field intensity distribution $D_{11}$ of the zone $Z_{11}$ and in the middle portion the far field distribution $D'_{11}$ produced by the associated mirror element $M_{11}$ of the mirror array 46 is illustrated. The cross indicates the optical axis 60 of the illumination system 12. The far field intensity distribution $D'_{11}$ would be obtained if the mirror would reflect a parallel light bundle.

The convolution of both far field intensity distributions $D_{11}$ and $D'_{11}$, which is indicated by a convolution symbol 88, results in a shift of the far field intensity distribution $D_{11}$ so that the intensity distribution $D_{11}$ is now centered with respect to the intensity distribution $D'_{11}$ produced by the mirror element $M_{11}$ of the mirror array 46. In this configuration the tilt angle of the mirror element $M_{11}$ is selected such that the vertex of the triangle forming the convoluted far field intensity distribution $C_{11}$ is located on the optical axis 60.

Figure 5B:
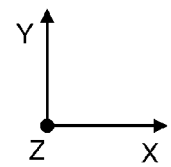
Figure 5B:
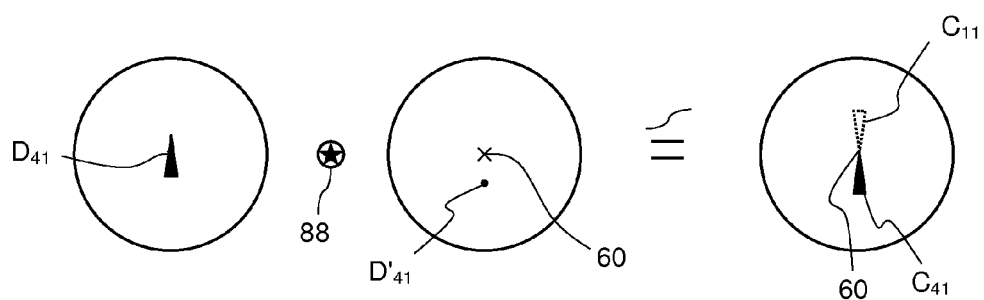

FIG. 5b illustrates the convolution of a far field intensity distribution $D_{41}$ produced by zone $Z_{41}$ with a far field intensity distribution $D'_{41}$ of the associated mirror element M41. The far field intensity distribution $D_{41}$ is identical to the far field intensity distribution $D_{11}$ except to its angular orientation which is rotated by 180°. The mirror element $M_{41}$, which is associated with zone $Z_{41}$, is tilted such that the far field intensity distribution $D'_{41}$ is, in comparison with the far field intensity distribution $D'_{11}$, arranged on the opposite side of the optical axis 60. As can be seen on the right hand side of FIG. 5b, this results in a shift of the far field intensity distribution $D_{41}$ along the $-Y$ direction such that the vertex of the triangle forming the convoluted far field intensity distribution $C_{41}$ is again positioned on the optical axis 60.

The optical far field distribution $C_{11}$ produced by the combination of the zone $Z_{11}$ and the mirror $M_{11}$, as illustrated in FIG. 5a, is indicated in FIG. 5b in dotted lines. This illustrates how more complex far field intensity distributions may be assembled by moving and combining the individual far field intensity distributions $D_{ij}$ produced by the zones $Z_{ij}$ by the associated mirror elements $M_{ij}$.

Figure 5C:
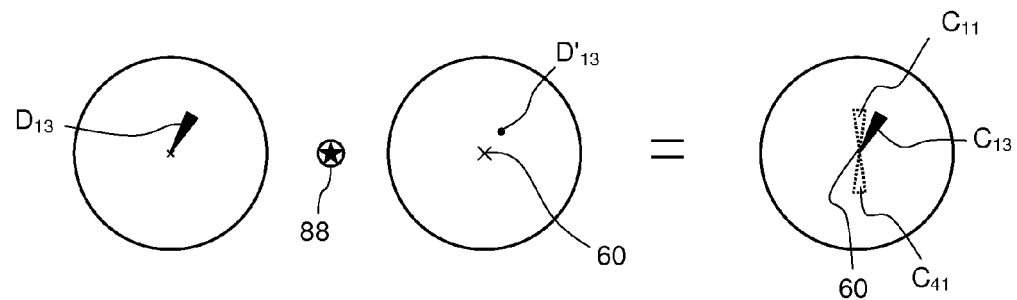

FIG. 5c shows a similar illustration for the convolution of the far field intensity distribution $D_{13}$ produced by the zone $Z_{13}$ with the far field intensity distribution $D'_{13}$ which is produced by the mirror element $M_{13}$ being associated by optical conjugation with the zone $Z_{13}$.

If this process of adding convoluted far field intensity distributions $C_{ij}$ is repeated for all mirror elements $M_{ij}$, a total far field intensity distribution C is obtained which is a superposition of the convoluted far field intensity distributions $C_{ij}$. This principle is similar to combining different jigsaw puzzle pieces to a new pattern. The jigsaw puzzle pieces (i.e. far field intensity distributions $D_{ij}$) are moved in a plane by tilting the associated mirror elements $M_{ij}$, so to speak.

If the mirror elements $M_{ij}$ are curved along at least one direction, the reflective power of the mirror elements $M_{ij}$ has to be taken into account. The far field intensity distribution $D'_{ij}$ of a mirror element $M_{ij}$ will generally not simply be a dot any more, but will change its shape and could be an oval, for example. The convolution with the far field intensity distribution $D_{ij}$ produced by zone $Z_{ij}$ will then not simply be a displacement of this far field intensity distribution $D_{ij}$, but will also involve a deformation of the far field intensity distribution $D_{ij}$. By deforming the mirror elements, the shape of the convoluted far field intensity distributions $C_{ij}$ may be changed at least within certain limits.

Referring again to FIG. 6, it is illustrated how the far field intensity distributions $D_{ij}$ are combined so that a two-dimensional total far field intensity distribution $C_a$ has approximately the geometry of a circular disc. Since the individual far field intensity distributions $D_{ij}$ have a triangular geometry, the circumference of this disk is not perfectly circular, but can be described by a regular polygon having z=24 corners, with z being the total number of Zones $Z_{ij}$. For achieving such a far field intensity distribution the mirror elements $M_{ij}$ have to be tilted such that the far field intensity distributions $D'_{ij}$ produced by the mirror elements $M_{ij}$ are arranged on a circle around the optical axis 60, as is shown in the middle of FIG. 6.

As will become clear from the further description, a wide variety of different total far field intensity distributions may be produced by appropriately tilting the mirror elements $M_{ij}$, thereby moving the individual far field intensity distributions $D_{ij}$ produced by the zones $Z_{ij}$ within the pupil surface 70. In the embodiment shown in FIG. 2, an additional degree of freedom is provided by the zoom lens system 58 and the pair 64 of axicon elements 66, 68. This is because these optical elements additionally modify the intensity distribution in the pupil surface 70 that finally determines the angular distribution of projection light impinging on the mask 16. For example, the size of the area illuminated in the pupil plane 54 may be varied by changing the focal length of the zoom lens system 58. In the configuration illustrated in FIG. 6, this means that the diameter of the (approximately) disc-shaped illuminated area in the pupil surface 70 can be selected such that a conventional illumination setting with an optimum degree of coherence σ is achieved. If the axicon elements 66, 68 are moved apart, an annular region will be illuminated in the pupil surface 70, wherein certain geometrical parameters may be further modified by changing the focal length of the zoom lens system 58.

However, an increased flexibility with respect to the illumination of the pupil surface 70 is provided by the capability of almost freely moving the far field intensity distributions $D_{ij}$ produced by the zones $Z_{ij}$ over the pupil surface 70 using the mirror array 48, as will be explained in the next section.

4. Illumination Setting Variation Using Mirror Array

FIGS. 7 to 10 are schematic representations similar to FIG. 6 which illustrate how the far field intensity distributions $D_{ij}$ produced by the zones $Z_{ij}$ of the optical raster element 34 can be assembled in different configurations, thereby obtaining a wide variety of different illumination settings.

Figure 7:
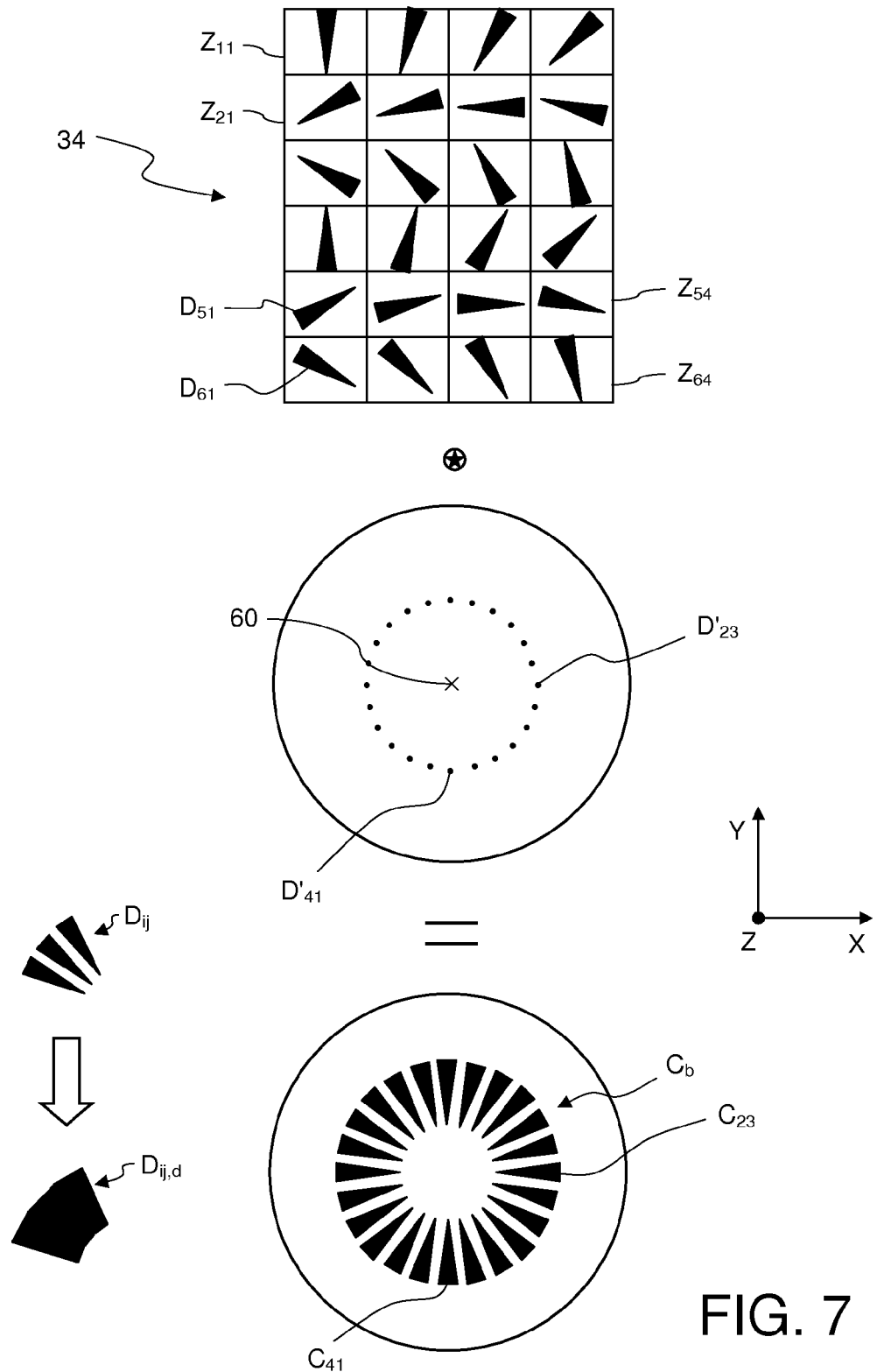

The configuration illustrated in the bottom portion of FIG. 7 is obtained with mirror elements $M_{ij}$ being tilted such that the far field intensity distributions $D'_{ij}$ produced by the individual mirror elements $M_{ij}$ are located on a circle around the optical axis 60 which has a larger diameter as compared to the configuration shown in FIG. 6. As a result, the far field intensity distributions $D_{ij}$ are moved radially outward, as can be seen in the bottom portion of FIG. 7. The far field intensity distributions $D_{ij}$ are now separated from each other by small gaps, but the resulting total far field intensity distribution $C_b$ now approximates an annular intensity distribution.

If the mirror elements $M_{ij}$ are deformable, as has been explained above in section 3, the far field intensity distributions $D_{ij}$ may be broadened by deforming the mirror elements $M_{ij}$ to such an extent that the gaps between the far field intensity distributions $D_{ij}$ are decreased in size or completely vanish. This is schematically illustrated in the left bottom portion of FIG. 7 in which it is shown how the broadening of far field intensity distributions $D_{ij}$ to deformed distributions $D_{ij,d}$ results in a filling of the gaps and thus in a better approximation of an annular intensity distribution.

Figure 8:
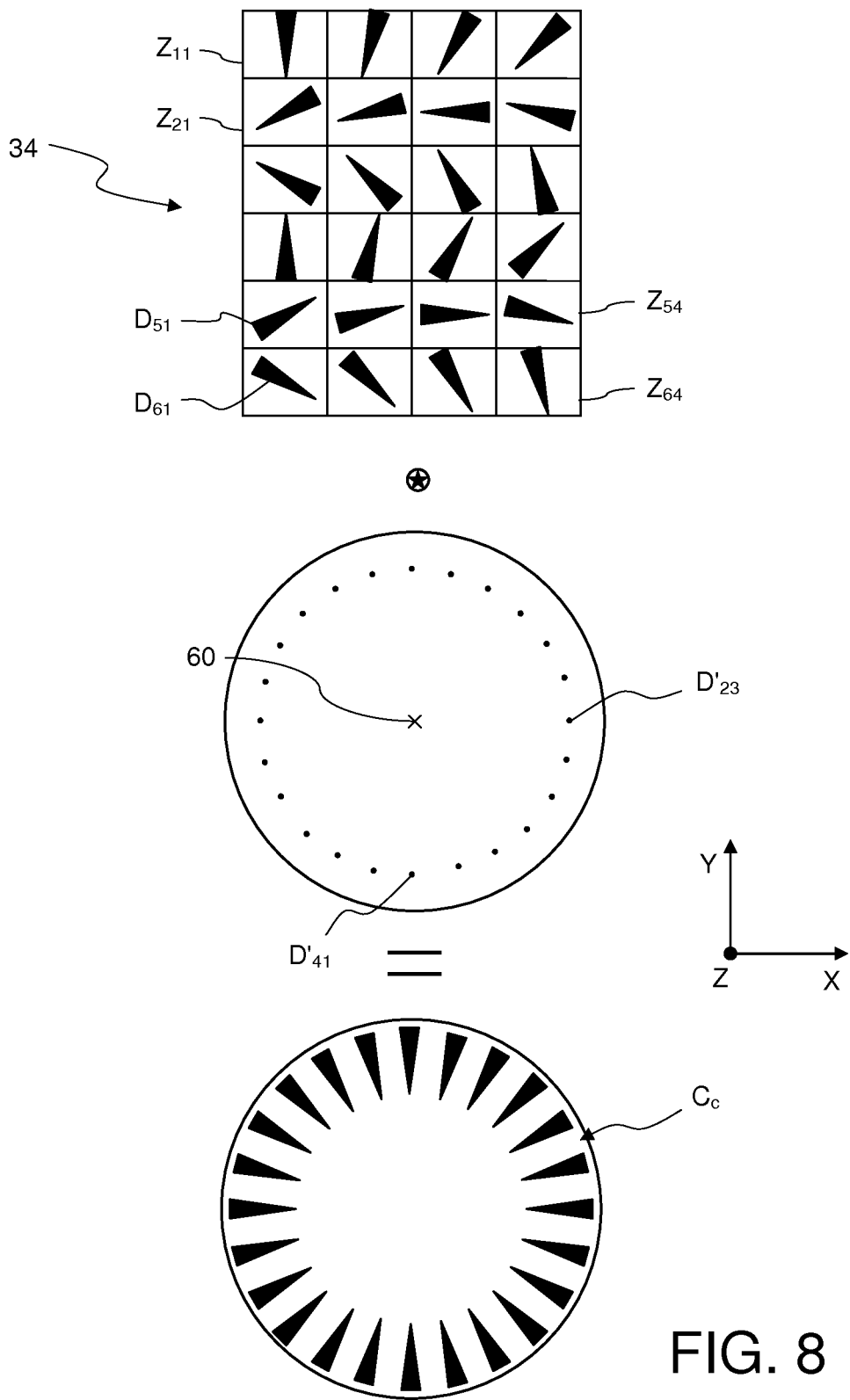

In the configuration illustrated in FIG. 8, the far field intensity distributions $D'_{ij}$ produced by the mirror elements $M_{ij}$ are still further shifted radially outward, resulting in a total far field intensity distribution $C_c$. Consequently, the convolution indicated by convolution symbol 88 results in an approximately angular illumination setting in which the illuminated annulus has still the same width, but increased inner and outer diameters.

Figure 9:
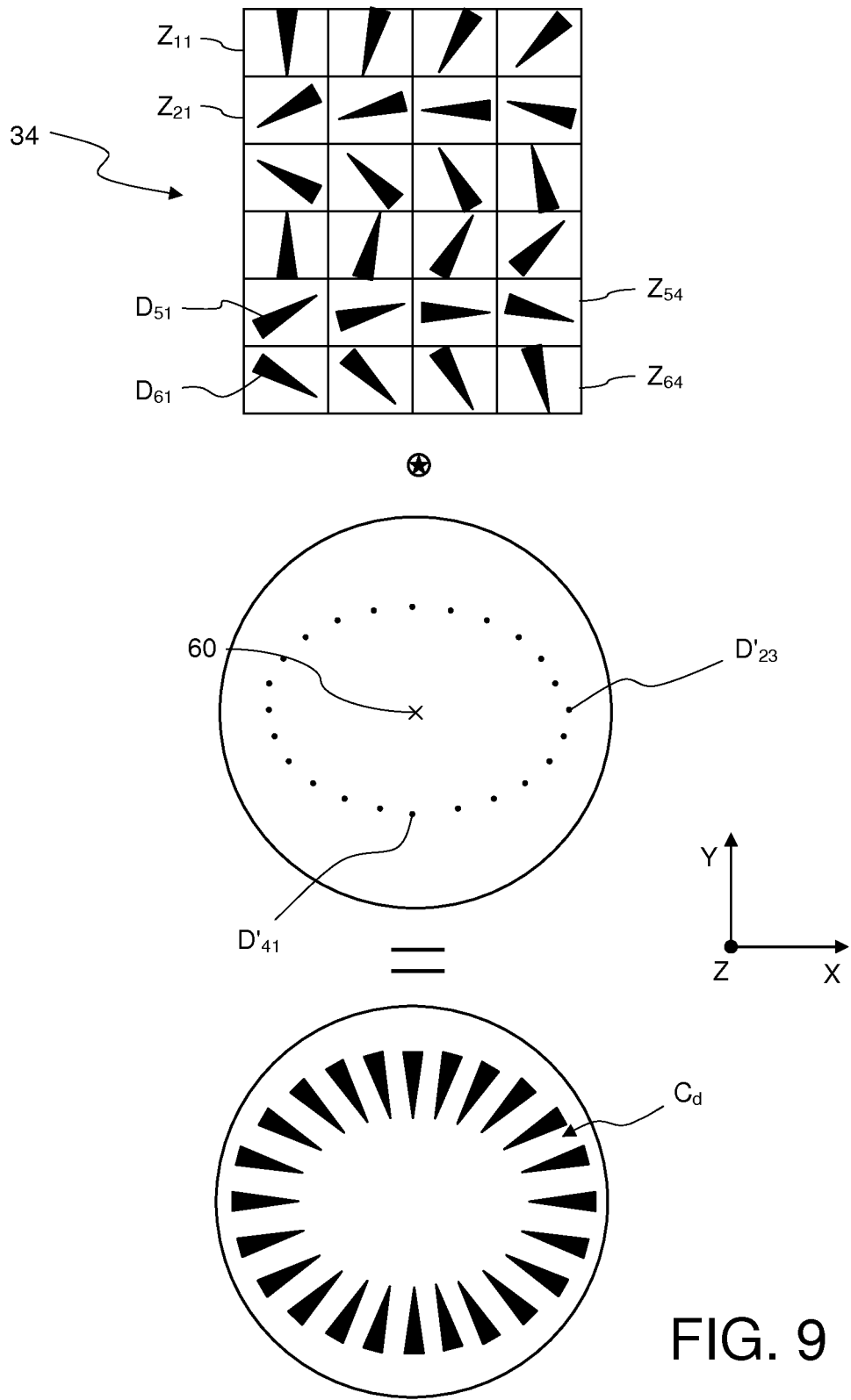

The configuration illustrated in the bottom portion of FIG. 9 is obtained by locating the far field intensity distributions $D'_{ij}$ produced by the mirror elements $M_{ij}$ on an ellipse centered around the optical axis 60. Convoluting this far field intensity distribution with the far field intensity distribution $D_{ij}$ produced by the optical raster element 34 results in a total far field intensity distribution $C_d$ having substantially the shape of an elliptical annulus, as can be seen in the bottom portion of FIG. 9. This embodiment makes clear that the provision of a plurality of individually controllable mirror elements $M_{ij}$ makes it possible to produce asymmetric modifications of the illumination setting that cannot be achieved with rotationally symmetric optical elements, such as lenses or axicon elements.

Figure 10:
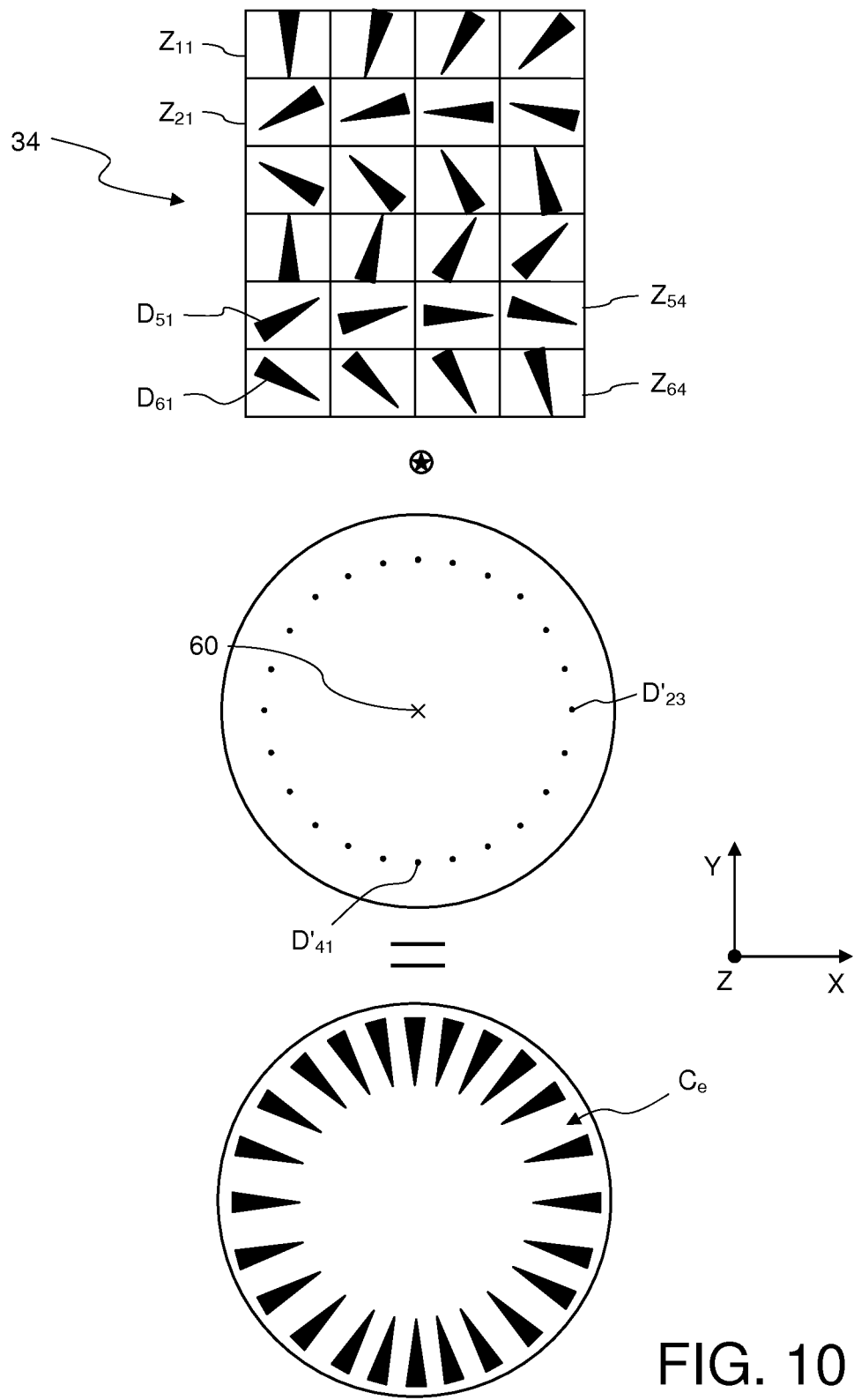

The configuration illustrated in the bottom portion of FIG. 10 is obtained by starting with the configuration shown in FIG. 8 and additionally slightly adjusting the tilting angles of at least some of the individual mirror elements $M_{ij}$ so that the distance between adjacent far field intensity distributions $D'_{ij}$ decreases with increasing Y coordinates. As can be seen in the bottom portion of FIG. 10, the total far field intensity distribution $C_e$, which is obtained for this particular configuration of the mirror elements $M_{ij}$, still approximates an angular illumination setting. Thus there is only a limited range of angles of incidence under which light rays fall obliquely on the mask 16.

However, upon comparing the total far field intensity distributions $C_c$ and $C_e$ shown in the bottom portions of FIGS. 8 and 10, respectively, it becomes clear that the energy distribution is slightly different. More particularly, more light energy impinges on points in the mask plane 86 from opposite +Y and −Y directions as in opposite −X and +X directions. The energy distributions in different angular segments produced in the mask plane 86, which is sometimes referred to as pupil ellipticity, may thus be modified by changing the tilt angles of some or more mirror elements $M_{ij}$. This effect may be used to produce an asymmetry of the pupil illumination (i.e. pupil ellipticities E≠1) which may advantageous for projecting certain types of masks 16. However, usually such asymmetries are not desired. Therefore, in the general case, the capability of adjusting the pupil ellipticity with the help of the mirror array 48 will rather be used to compensate detrimental effects on the pupil ellipticity produced by other optical components of the illumination system 12, thereby achieving an (almost) perfectly symmetric pupil illumination (i.e. a pupil ellipticity E=1).

Figure 11:
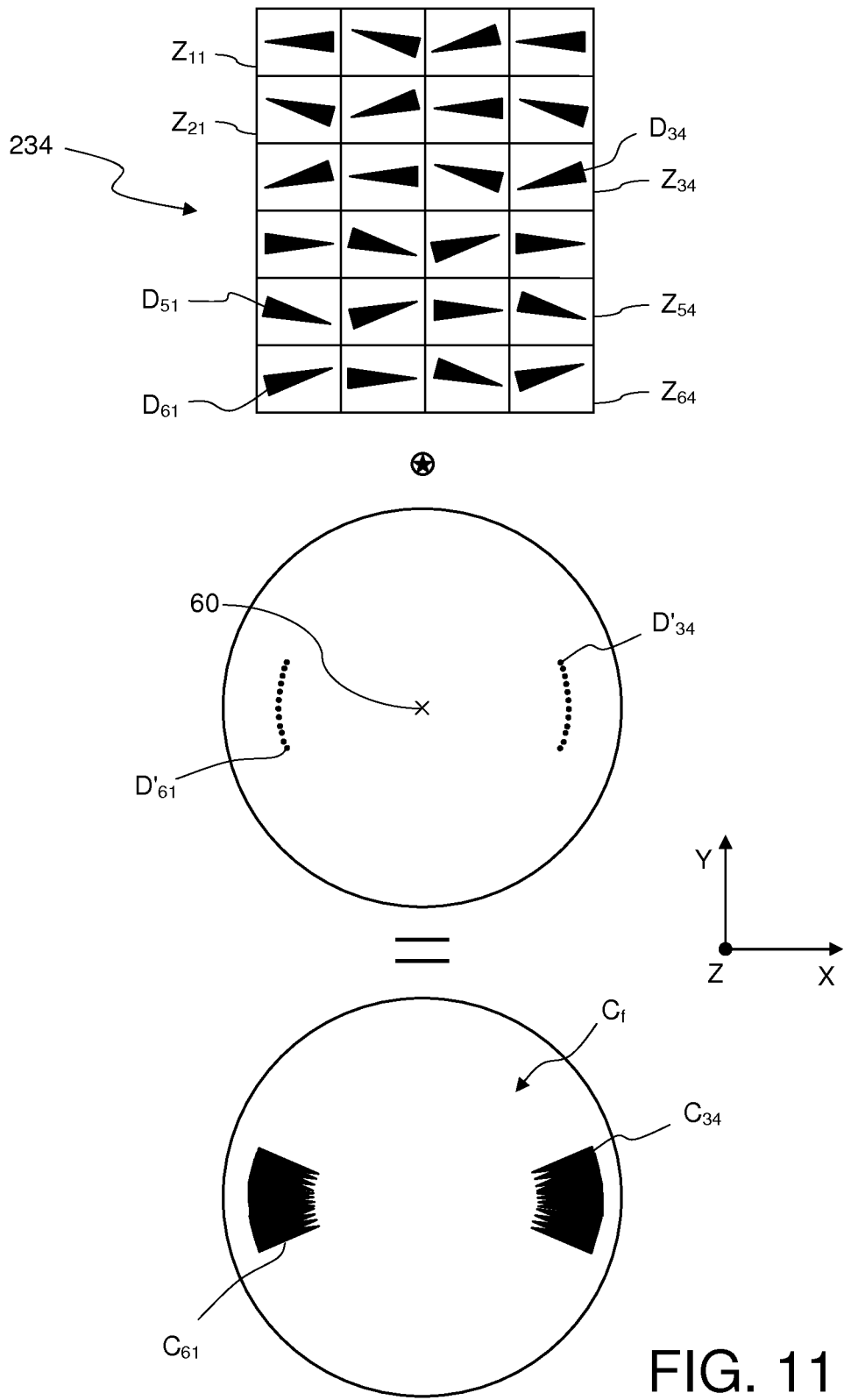
FIGS. 11 and 12 are schematic drawings similar to FIG. 6, but for a different optical raster element.

The configuration illustrated in the bottom portion of FIG. 11 is obtained with a different optical raster element 234 that is introduced in the beam path of the illumination system 12. To this end an exchange holder may be provided that makes it possible to insert different optical raster elements into the optical beam path. Such an exchange holder may also be realized as a turret containing a plurality of different optical raster elements that can be introduced individually into the optical beam path by rotating the turret.

The optical raster element 234, which is now inserted into the optical beam path, contains the same number of zones $Z_{ij}$, but these zones $Z_{ij}$ produce not the same far field intensity distributions $D_{ij}$ as the zones of the optical raster element 34 discussed above. More particularly, the far field intensity distributions $D_{ij}$ have again the shape of isoscales triangles but the angular orientation of the triangles varies only within two small ranges of angles. With one half of the far field intensity distributions $D_{ij}$ shown in the upper half of the optical raster element 234, the triangles point towards the −X direction. With the other half of the far field intensity distributions $D_{ij}$ shown in the lower half of the optical raster element 234, the triangles point towards the +X direction. There are always three identical far field intensity distributions which also have the same angular orientation. By suitably arranging these far field intensity distributions $D_{ij}$ with the help of the mirror array 46, a total far field intensity distribution $C_f$ is obtained in which two opposite poles are formed along the X direction, thereby achieving a dipole illumination setting. In this case the far field intensity distributions $D'_{ij}$ produced by the mirror elements $M_{ij}$ are arranged on two curved lines that are arranged symmetrical with respect to the optical axis 60.

Figure 12:
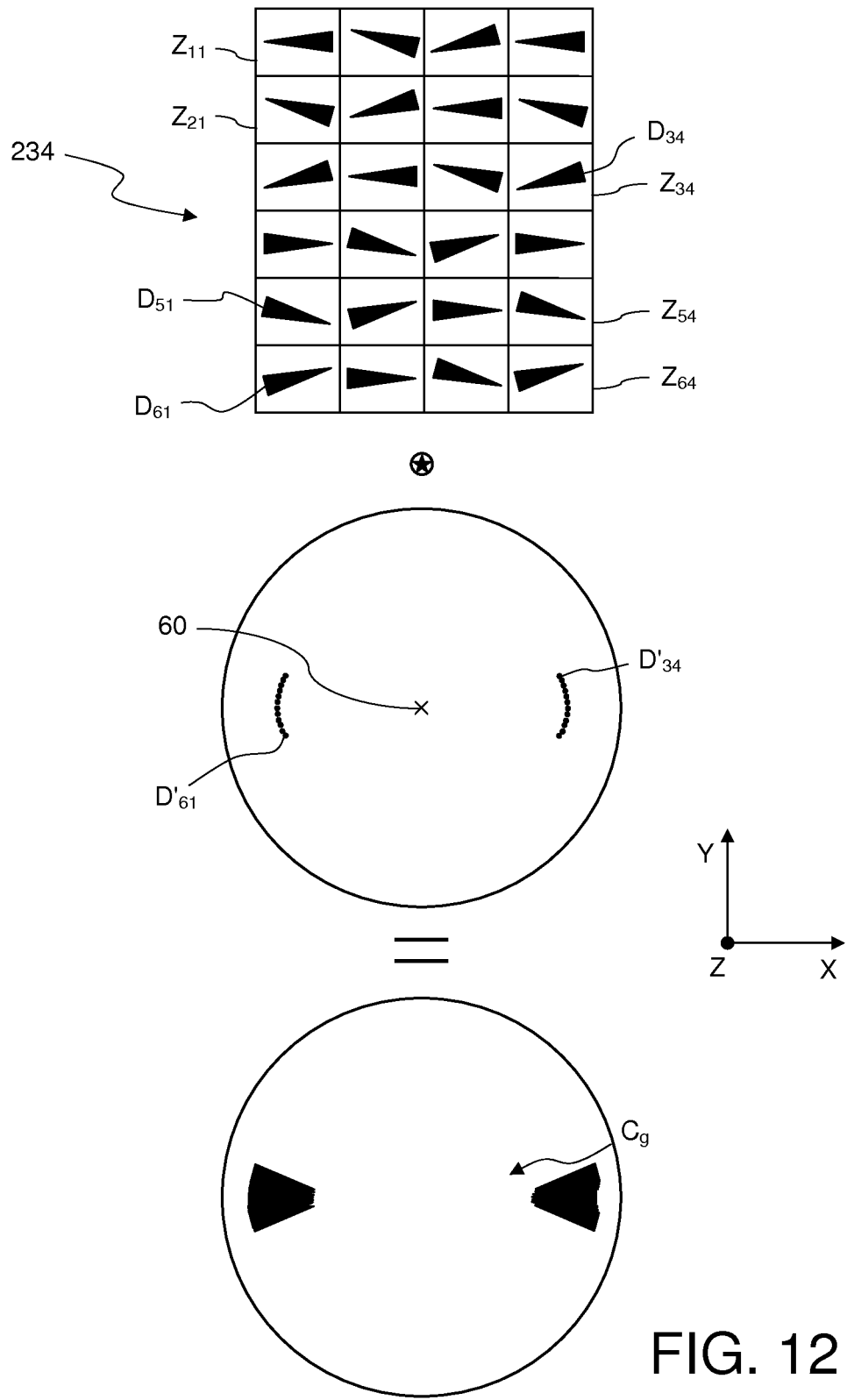

The configuration illustrated in the bottom portion of FIG. 12 is obtained by slightly rearranging the far field intensity distributions $D_{ij}$. More particularly, if the mirror elements $M_{ij}$ are adjusted such that the far field intensity distributions $D'_{ij}$ produced by the mirror elements $M_{ij}$ are positioned more closely together, the two poles of the resulting total far field intensity distribution $C_g$ will have a decreased width along the Y direction.

Figure 13:
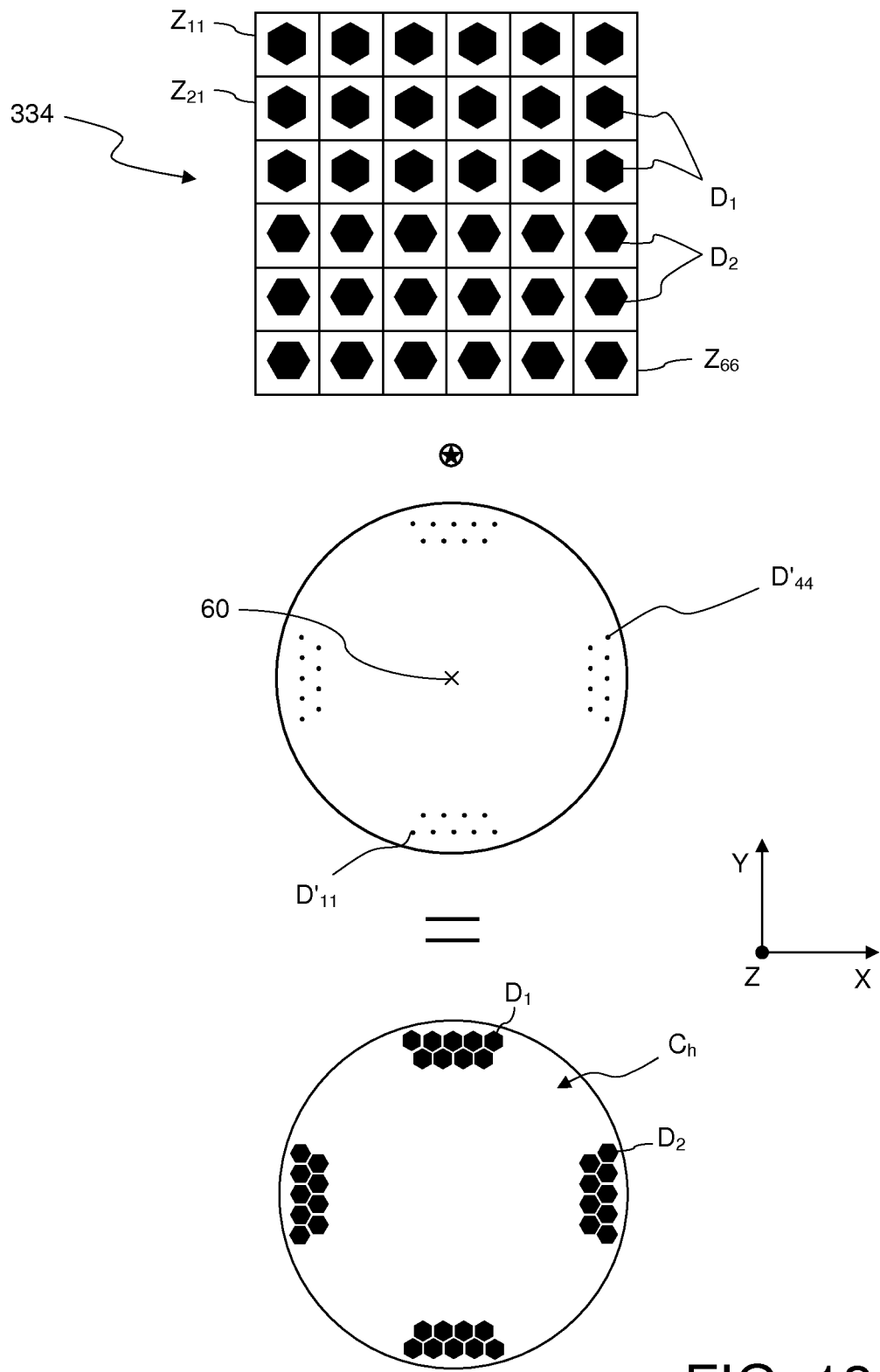
FIG. 13 is a schematic drawing similar to FIG. 6, but for a still another optical raster element.

FIG. 13 shows, in a representation similar to FIG. 6, the convolution of far field intensity distributions produced by still another optical raster element 334 with far field intensity distributions produced by the mirror elements $M_{ij}$. The optical raster element 334 replaces the optical raster element 34 shown in FIG. 2.

The optical raster element 334 differs from the optical raster elements 34 and 234 described above in that there are only two different far field intensity distributions produced by the zones $Z_{ij}$. However, there is again a basic shape of the far field intensity distribution, which is defined, in this particular embodiment, by a regular hexagon. The far field intensity distributions $D_{11}$ to $D_{36}$ are obtained from the far field intensity distributions $D_{41}$ to $D_{66}$ by a rotation around 30°, or generally by 30°+k·x·60°, with k=0, 1, 2, 3, . . . around the center of the hexagons. Since the far field intensity distributions $D_{11}$ to $D_{36}$ on the one hand and the far field intensity distributions $D_{41}$ to $D_{66}$ on the other hand do not differ, the optical raster element 334 may also be considered as including only two different larger zones $Z_1$ and $Z_2$, wherein the zones $Z_1$ and $Z_2$ produce hexagonal far field intensity distributions $D_1$ and $D_2$, respectively, of different angular orientation. Mirror elements $M_{11}$ to $M_{36}$ of a 66 mirror array are then commonly associated with zone $Z_1$, and the remaining mirror elements $M_{41}$ to $M_{66}$ are associated to the zone $Z_2$.

In FIG. 13 the mirror elements $M_{ij}$ are tilted such that the resulting total far field intensity distribution $C_h$ contains four poles corresponding to a quadrupole illumination setting. The hexagons arranged in one orientation (i.e. far field intensity distributions $D_{41}$ to $D_{66}$) form the two poles along the X direction, and the hexagons rotated by 30° (i.e. far field intensity distributions $D_{11}$ to $D_{36}$) form the other pair of poles along the Y direction. As a result of the different angular orientations, the two poles extending along the X direction are perfectly symmetrical in shape and arrangement to the poles extending along the Y direction. Generally, the hexagonal geometry of the far field intensity distributions $D_{ij}$ has the advantage that hexagons may be assembled to larger areas without leaving any gaps between adjacent far field intensity distributions $D_{ij}$. In contrast to rectangles, however, continuous intensity distributions may be produced having contours that nevertheless approximate curved lines.

Figure 14:
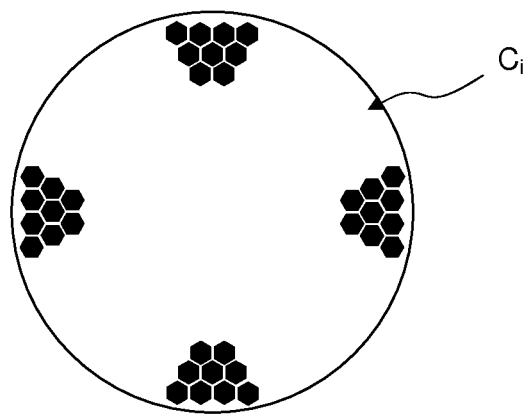
FIGS. 14 to 16 illustrate total far field intensity distributions obtained with the optical raster element shown in FIG. 13, but with different configurations of the mirror array.

FIG. 14 shows a readjusted total far field intensity distribution denoted by $C_i$ which is obtained from the configuration shown in FIG. 13 by rearranging some of the far field intensity distributions $D_{ij}$ with the help of the mirror elements $M_{ij}$. The poles of the quadrupole illumination setting now have a more triangular shape as compared with the far field intensity distribution $C_h$ shown in FIG. 13.

Figure 15:
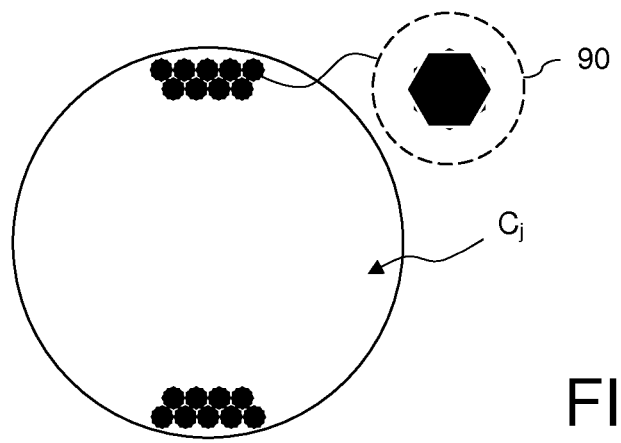

FIG. 15 shows another total far field intensity distribution denoted by $C_j$. Here pairs of two hexagonal far field intensity distributions $D_1$ and $D_2$ having different angular orientations are superimposed, as can be clearly seen in the cut-out denoted by 90. Two far field intensity distributions $D_1$, $D_2$ superimposed at a particular location in the pupil surface 70 result in a combined far field intensity distribution having the shape of a twelve-angled regular polygon, with a centered portion formed by a dodecagon in which the intensity is doubled. The total far field intensity distribution, which is denoted by $C_j$ and may be regarded as being assembled from a plurality of these combined far field intensity distributions, includes again two poles arranged along the Y direction, which corresponds to a dipole illumination setting.

Figure 16:
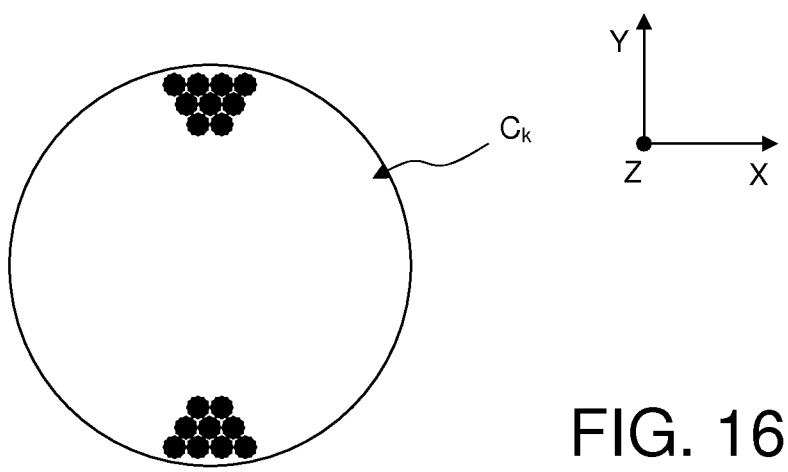

FIG. 16 shows, for the same optical raster element 324, a similar total far field intensity distribution denoted by $C_k$. This total far field intensity distribution $C_k$ is obtained by tilting some of the mirror elements $M_{ij}$ in a way similar to what has been explained above with reference to FIGS. 13 and 14.

5. Alternative Embodiments

It should be well understood that various alternative embodiments are presently contemplated that are still within the scope of the present invention.

For example, the mirror array 46 may be replaced by any other reflective structure that makes it possible to direct light rays impinging on the structure into various directions, wherein the directions can be changed individually for different portions of the structure upon application of a suitable control signal. Such alternative structures may include, for example, electro-optical or acousto-optical elements. In such elements the refractive index may be varied by exposing a suitable material to ultrasonic waves or electric fields, respectively. These effects can be exploited to produce index gratings that direct impinging light into various directions.

As a matter of course, the zoom lens system 58 and/or the pair 64 of axicon elements 66, 68 may be completely dispensed with. The fly-eye lens 72 could be replaced by any other optical element, for example a diffractive optical element, which increases the geometrical optical flux. The use of a light mixing rod instead of a fly's eye lens is also contemplated. Furthermore, the mask 16 may be directly positioned in the field plane 80 if there is no need to have an illuminated field 14 having sharp edges at least along one direction.

Figure 17:
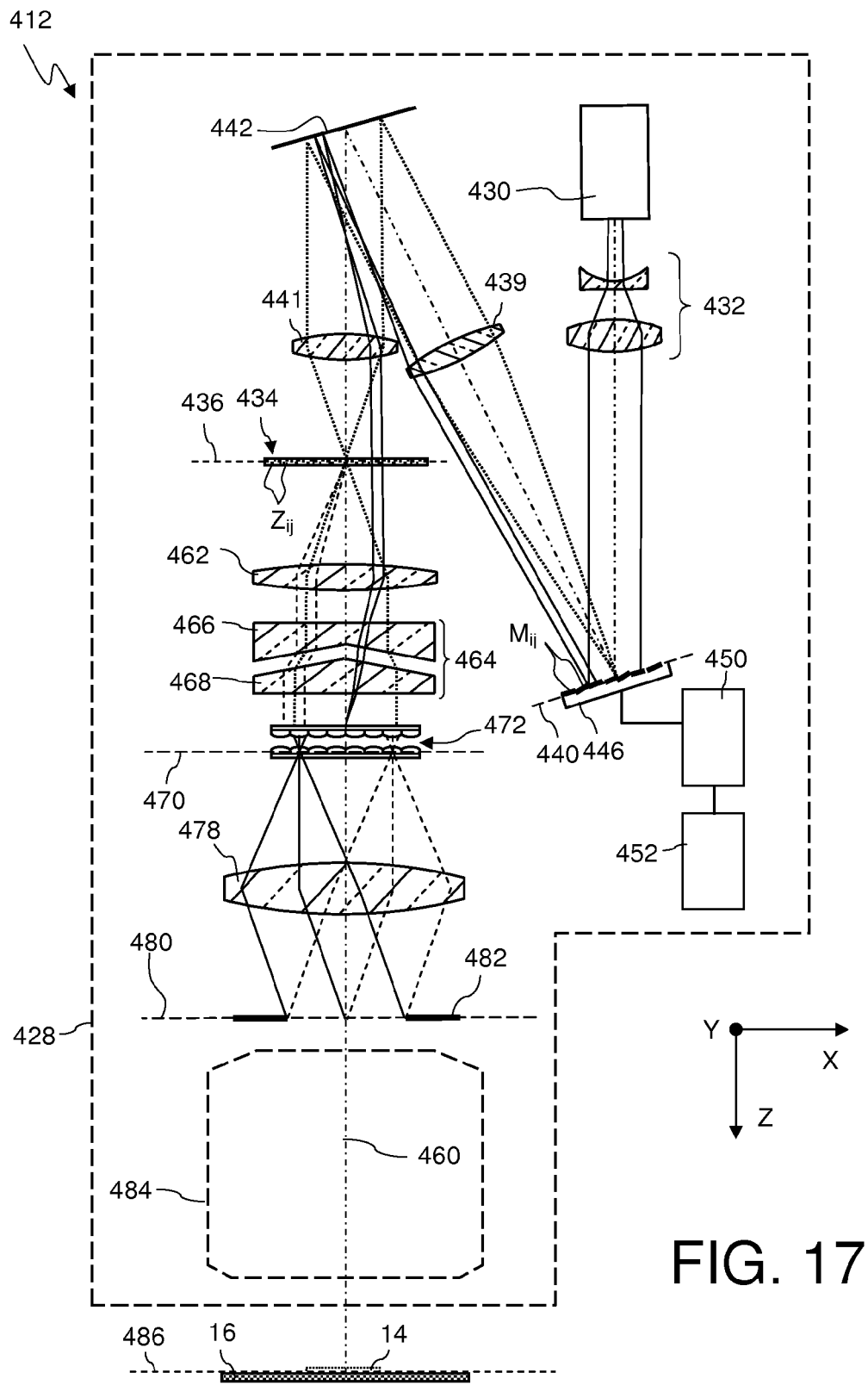
FIG. 17 is a meridional section through an illumination system.

From the foregoing it should also have become clear that the order of the optical raster element 34 and the mirror array 46 may equally be reversed. An illumination system 412 with such a configuration is shown in FIG. 17, which is a schematic illustration similar to FIG. 2. In FIG. 17 components corresponding to those shown in FIG. 2 are denoted by the same reference numerals augmented by 400; most of these components will not be explained again.

Again each mirror element $M_{ij}$ of the mirror array 446 is associated, by optical conjugation, to a certain zone on the optical raster element 434 which is arranged between the optical imaging system 438 and the zoom lens system 458. The direction, under which a light bundle impinges on a particular zone $Z_{ij}$ on the optical raster element 434, depends on the tilting angle of the associated mirror element $M_{ij}$.

Figure 18:
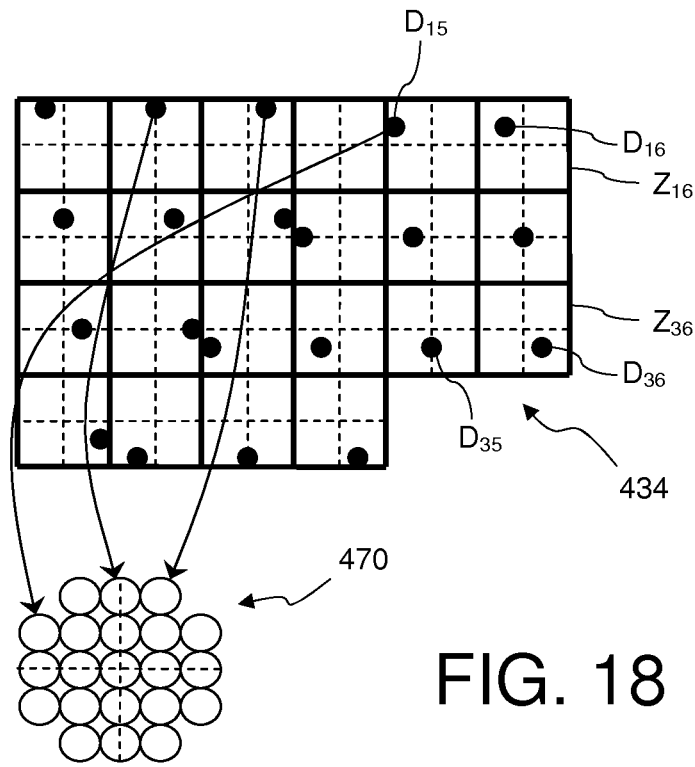
FIG. 18 is a top view on an optical raster element contained in the illumination system of FIG. 17, together with a schematic illustration of the pupil surface.

FIG. 18 shows a cut-out of the optical raster element 434 in an illustration similar to the upper portion of FIG. 6. Here the zones $Z_{ij}$ produce different far field intensity distributions $D_{ij}$ which have the same circular spot-like basic shape, but are arranged at different locations in the far field. This is in contrast to the embodiments described above, because there only the shape of the far field intensity distributions produced by the individual zones $Z_{ij}$ had been different, with the distributions as such being centered.

In the embodiment shown in FIG. 18, the locations of the spot-like far field intensity distributions $D_{ij}$ are determined such that the pupil surface 470 is almost completely filled with these distributions $D_{ij}$, as it is shown in the bottom portion of FIG. 18.

Such a configuration of the optical raster element 434 makes it possible to use a mirror array in which the mirror elements $M_{ij}$ are adapted to be either in an "on" state or in an "off" state. In the "on" state a reflected light beam passes the pupil surface 470, wherein in the "off" state no reflected light ray is allowed to pass the pupil surface 470.

Such a digital mirror array 446 may have a much simpler construction, because it is not necessary to control a continuous range of tilting angles, as is the case with the embodiments described above. Therefore the pupil surface 470 may be filled with an arbitrary pattern of small circular illuminated spots by switching on and off individual mirror elements $M_{ij}$.

Since the zones $Z_{ij}$ of the optical raster element 434 produce the illuminated spots at different locations, the tilting angle of the mirror elements $M_{ij}$ may be the same for all "on" states. This again simplifies the construction and control of the mirror array 446. If all zones $Z_{ij}$ produced exactly the same far field intensity distribution, the "on" states of the mirror elements $M_{ij}$ would correspond to different tilting angles.

If the far field intensity distributions produced by the zones $Z_{ij}$ are circular spots, as it is shown in FIG. 18, the total filling rate of the pupil surface 70 is $\pi/4=78.5\%$, if all mirror elements are in the "on" state. With other far field intensity distributions, for example the hexagonal geometries shown in FIG. 13, a higher filling ratio or even a complete filling of the pupil surface 470 may be achieved.

If it shall be possible to vary the intensity at each location on the pupil surface 70, it is desirable to be able to superimpose at least two far field intensity distributions produced by different zones $Z_{ij}$. Generally, if there shall be N+1 equidistant intensity values, there have to be N mirror elements $M_{ij}$ that superimpose far field intensity distributions at the particular location in the pupil surface.

Figure 19:
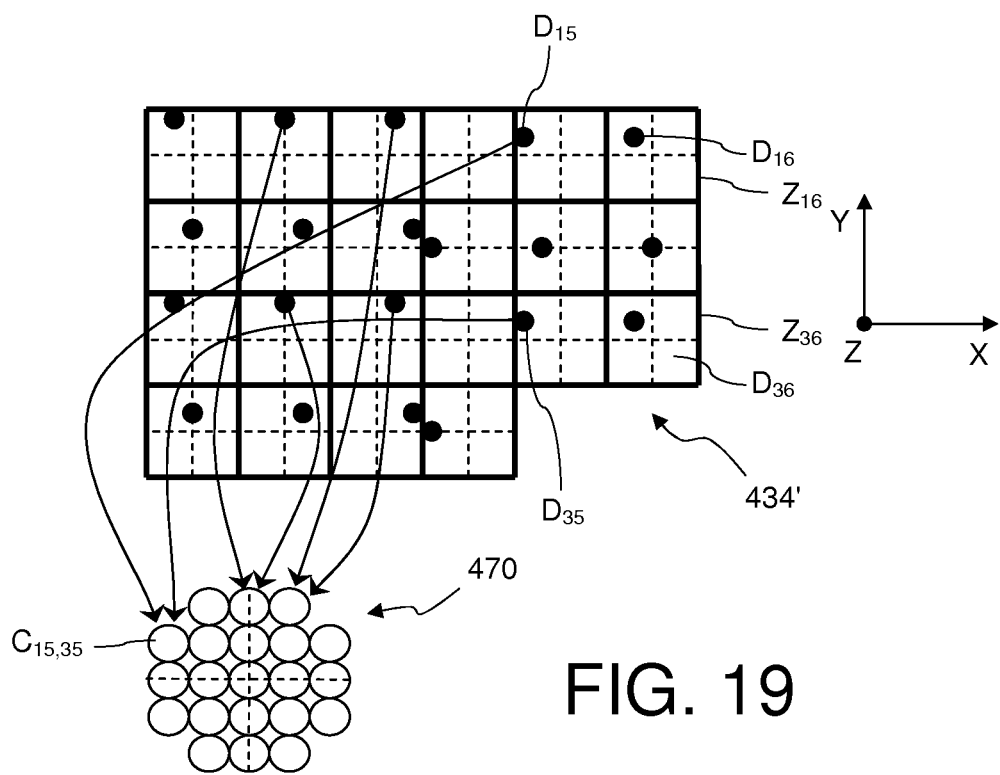
FIG. 19 is a top view on a different optical raster element that may be contained in the illumination system of FIG. 17.

This is illustrated in FIG. 19 for an optical raster element 434', in which pairs of zones producing exactly the same far field intensity distribution are associated to a single mirror element $M_{ij}$. For example, if the zones $Z_{15}$ and $Z_{35}$ are activated by switching on the associated mirror elements $M_{15}$ and $M_{35}$, the respective location in the pupil surface 470 is illuminated with twice the intensity that would be obtained if only one of the mirror $M_{15}$ and $M_{35}$ would be in the "on" state.

Figure 20:
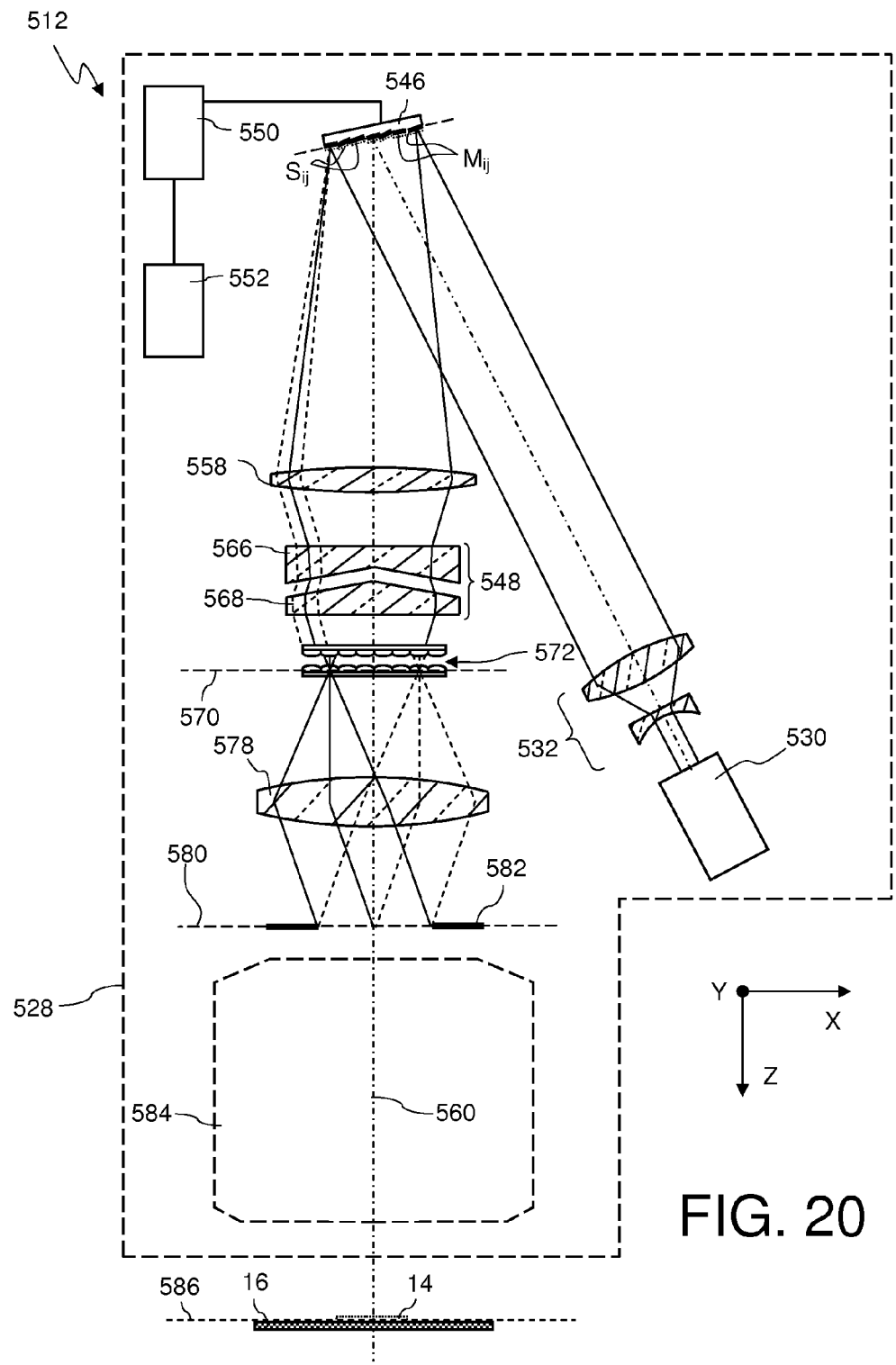
FIG. 20 is a meridional section through an illumination system.

FIG. 20 shows an embodiment of an illumination system 512 in accordance with another aspect of the invention. In FIG. 20 components corresponding to those shown in FIG. 2 are denoted by the same reference numerals augmented by 500; most of these components will not be explained again.

Figure 21:
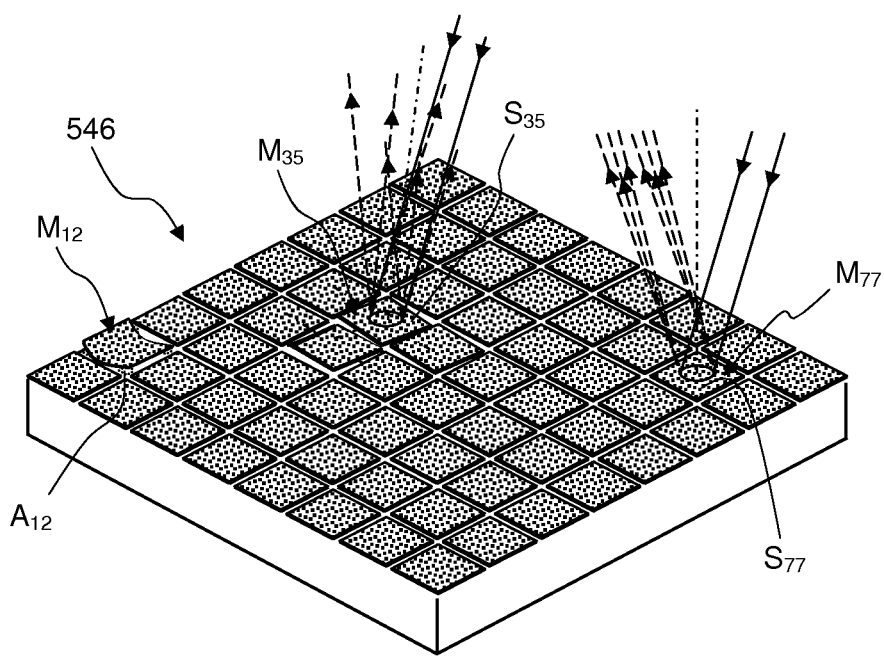
FIG. 21 is a perspective view of a mirror array for use in the illumination system of FIG. 20, including mirrors that support diffractive structures.

In the illumination system 512 the optical raster element 534 and the mirror array 546 are not arranged in planes that are optically conjugated by an optical imaging system, but in coinciding planes. To this end, the mirror elements $M_{ij}$ support diffractive structures $S_{ij}$, wherein at least two of the diffractive structures $S_{ij}$ produce different far field intensity distributions. This is illustrated in FIG. 21, which shows a perspective view of the mirror array 546. In this exemplary illustration it is assumed that the mirror element $M_{77}$ produces a narrower angular distribution than the mirror element $M_{35}$. Thus essentially the same effect is achieved as if different zones of an optical raster element are imaged on mirror elements, or vice versa.

Figure 22:
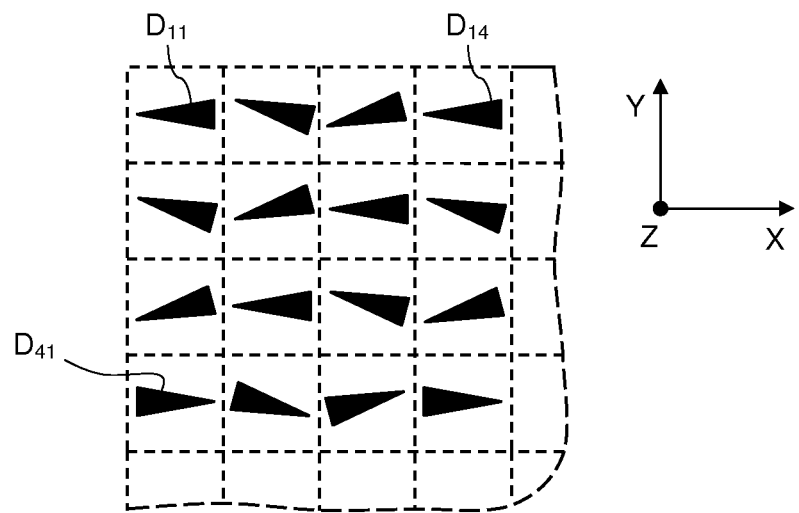
FIG. 22 illustrates the far field intensity distributions produced by the diffractive structures supported by the mirrors of the array shown in FIG. 21.

This makes clear that the diffractive structures $S_{ij}$ may produce, at least in principle, the same far field intensity distributions as the zones $Z_{ij}$ of the embodiments described above. FIG. 22 illustrates an example of the far field distributions $D_{ij}$ that may be obtained by the diffractive structures $S_{ij}$ supported by the mirror elements $M_{ij}$. These far field intensity distributions $D_{ij}$ are identical to the far field intensity distributions described above with reference to FIG. 12 for the optical raster element 34 which is imaged onto the mirror array 46. However, it is to be understood that not only the far field intensity distributions described above, but almost any arbitrary far field intensity distribution may be produced by the diffractive structures $S_{ij}$ supported by the mirror elements $M_{ij}$.

The concept of having mirror elements $M_{ij}$ supporting diffractive structures may also be applied to the embodiment shown in FIG. 2. Then the far field intensity distribution produced by the additional diffractive structures "adds" to the total far field intensity distribution produced by the mirror array 46 and the optical raster element 34. More specifically, the total far field intensity distribution in the pupil surface 70 in this case is a superposition of convoluted far field intensity distributions obtained by convoluting the far field intensity distributions produced by a mirror element $M_{ij}$ of the mirror array 46, by the corresponding zone $Z_{ij}$ of the optical raster element and by the additional diffractive structures on the respective mirror element $M_{ij}$.

An additional degree of freedom is obtained if some or all mirror elements $M_{ij}$ are configured such that they can not only be tilted, but also be deformed with the help of actuators associated to the individual mirror elements $M_{ij}$. FIG. 21 shows this exemplarily for the mirror element $M_{12}$ which has been deformed by an actuator system $A_{12}$. As has been mentioned above with reference to FIG. 7, the effect of a mirror deformation is a change of the far field intensity distribution produced by the respective mirror element $M_{ij}$. Mirror deformation can thus be used to further modify the total far field intensity distribution, for example with the aim of reducing gaps between individual far field intensity distributions in the total far field intensity distribution obtained in the pupil surface 570.

Transparent beam deflection elements such as electro-optical or acousto-optical elements may support diffractive structures, too. Transparent beam deflection elements may also be subjected to deformations produced by actuators to which the elements are coupled.

FIG. 23 is a perspective view of a mirror array 646 which may also be used in the illumination system 512 shown in FIG. 20. The mirror array 646 contains mirror elements $M_{ij}$ that also support diffractive structures $S_{ij}$, however, the mirror elements $M_{ij}$ are not only rotatable with respect to two orthogonal tilt axes 656, 658, but also with respect to a third rotational axis 659. This additional rotational degree of freedom is indicated in FIG. 23 by a double arrow DA.

The tilt axes 656, 658 which are associated with two of the three degrees of freedom extend, in the embodiment shown, parallel to a plane, and the rotational axis 659 associated with the additional third rotational degree of freedom intersects this plane. The angle of intersection can be between 60° and 90°. In the embodiment shown the reflective surfaces of the mirror elements $M_{ij}$ are planar and parallel to the tilt axes 656, 658, and the additional rotational axis 659 is aligned perpendicular to the planar reflective surface of each mirror element $M_{ij}$. Other specific examples of rotational axis orientations are (1) perpendicular to a base plate of the mirror array 646 or (2) perpendicular to the pupil surface 570. Other orientations may be contemplated, too.

FIGS. 24a and 24b are enlarged perspective illustrations of a single mirror element $M_{ij}$ of the mirror array 646 shown in FIG. 23 in two different rotational positions. In these figures the triangles indicated with broken lines illustrate the far field intensity distribution $D_{ij}$ which is produced in the pupil surface 570 of the illumination system 512 by the diffractive structures $S_{ij}$ supported by the mirror element $M_{ij}$. If the mirror element $M_{ij}$ is rotated along the direction of the arrow in FIG. 24a, the far field intensity distribution $D_{ij}$ will also rotate in the pupil surface 570 by the same angle.

In order to facilitate the rotation of the mirror elements $M_{ij}$ around the third rotational axis, the mirror elements $M_{ij}$ have a circular geometry. This circular geometry entails that the gap between adjacent mirror elements $M_{ij}$, and thus the total area of the mirror array 646 which is not reflective, is considerably increased. In the illumination system shown in FIG. 20 this would result in significant light losses which may reduce the throughput of the projection exposure apparatus. Such light losses may also cause problems with regard to heat produced by light absorption in the gaps. This heat has to be efficiently removed by a cooling system which increases the system complexity.

Such problems may be avoided if a microlens array is arranged between the beam expansion unit 532 and the mirror array 646. Each microlens focuses the incoming light on one individual mirror element $M_{ij}$, and thus no light is lost in the gaps.

The additional rotational degree of freedom makes it possible to produce a much wider variety of different illumination settings as is the case with the mirror array 546 shown in FIG. 21. With the mirror array 546 shown in FIG. 21 it is possible to produce different dipole illumination settings, as is shown in FIGS. 11 and 12. Conventional or annular illumination settings such as shown in FIGS. 6 to 10 cannot be properly produced with the mirror array 546, but only with the mirror array 646.

Figure 25:
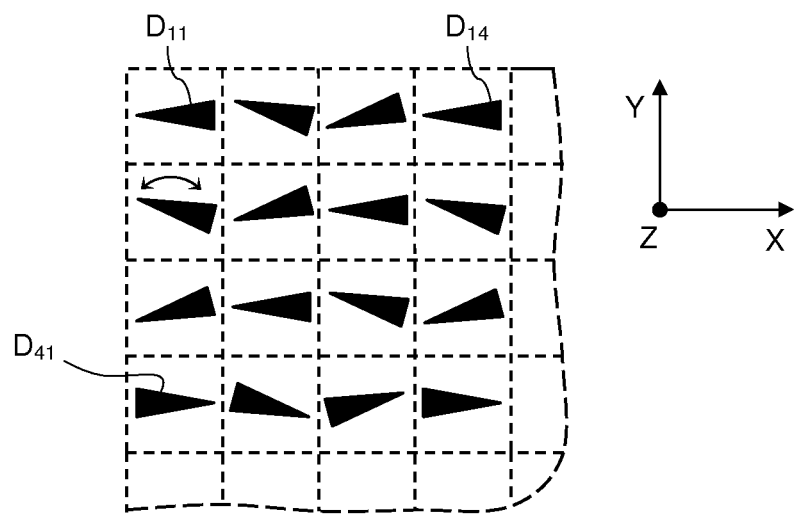
FIG. 25 illustrates the far field intensity distributions produced by diffractive structures supported by the mirrors of the array shown in FIG. 23, wherein the mirrors are arranged in first rotational positions.
Figure 26:
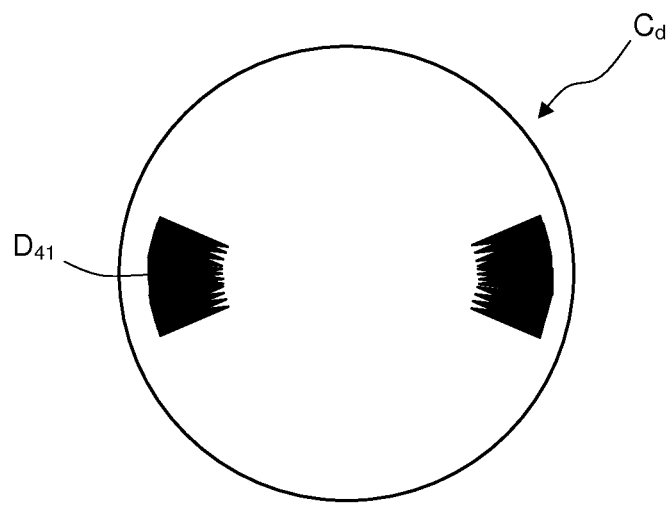
FIG. 26 illustrates a total far field intensity distributions (dipole setting) obtained with mirrors arranged in the first rotational positions as shown in FIG. 25.

This is illustrated in FIGS. 25 to 28. FIG. 25 is an illustration similar to FIG. 22. Here it is assumed that the mirror elements $M_{ij}$ of the mirror elements 646 are rotated such that the triangular far field intensity distribution $D_{ij}$ have orientations that vary only slightly. By suitably tilting the mirror elements $M_{ij}$ it is possible to obtain a dipole illumination settings as shown in FIG. 26.

Figure 27:
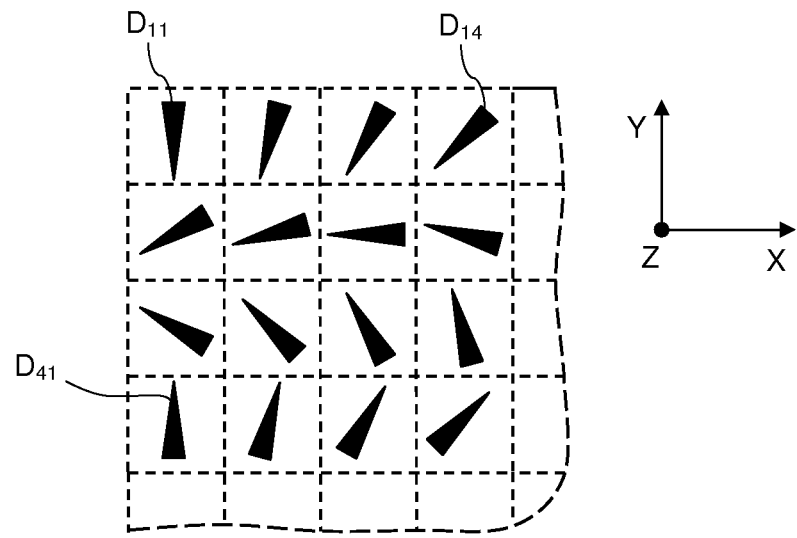
FIG. 27 an illustration similar to FIG. 25, wherein the mirrors are arranged in second rotational positions.
Figure 28:
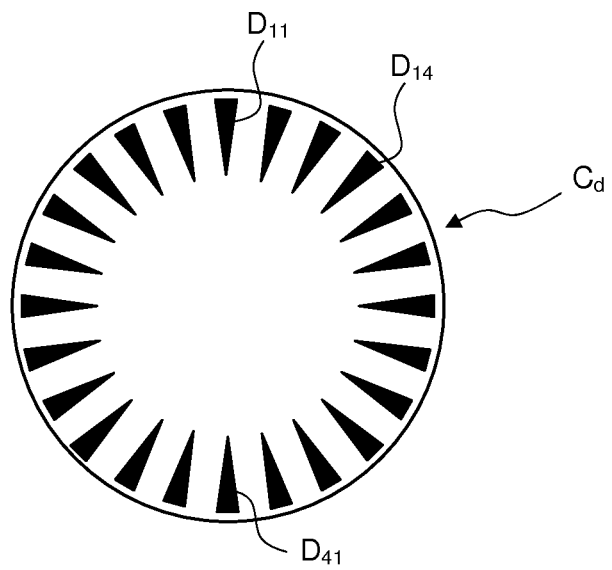
FIG. 28 illustrates a total far field intensity distributions (annular setting) obtained with mirrors arranged in the second rotational positions as shown in FIG. 27.

If an annular illumination setting shall be produced as shown in FIG. 28, the individual mirror elements $M_{ij}$ are rotated such that all possible orientations of the triangles are represented, as is shown in FIG. 27. These differently oriented triangles are then assembled by suitably tilting the mirror elements $M_{ij}$ so as to obtain the total far field intensity distribution $C_d$ shown in FIG. 28.

The additional rotational degree of freedom involves some mechanical modifications of the bearings and actuators that are involved for tilting and rotating the mirror elements $M_{ij}$. Since the mirror array 646 does not require very large numbers of mirror elements, precision mechanical solutions will usually suffice. A specific mechanical configuration for such bearings and actuators is described in a co-pending international application entitled: "Mirror matrix for a microlithographic projection exposure apparatus" which has been filed by the applicant on the same day as the present application and which claims priority of U.S. provisional application 60/913,956 filed Apr. 25, 2007.

A similar effect may be achieved if the mirror elements $M_{ij}$ do not support diffractive structures $S_{ij}$, but have, as a result of a rotationally asymmetric curvature at least along one direction, a reflective power. This situation is shown in FIG. 23 for the upper mirror element $M_{16}$. If the curvature is rotationally asymmetric, also the far field intensity distribution will be rotationally asymmetric. Thus a rotation of such a mirror will result in different far field intensity distributions. Although it is not possible with curved mirror elements $M_{ij}$ to produce sharp polygonal far field intensity distributions as shown in FIG. 25 or 27, for example, it may nevertheless be advantageous to be able to rotate elliptical far field intensity distributions that may be easily produced with curved mirrors.

The above description has been given by way of example. From the disclosure given, those skilled in the art will not only understand the disclosure and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

What is claimed is:

1. An illumination system having an optical axis and a pupil surface, the illumination system comprising:
    an array comprising deflection elements, each deflection element being reflective or transparent, each deflection element configured to deflect an impinging light ray by a deflection angle that can be varied, and the deflection elements being at least substantially arranged in a first plane;
    an optical raster element comprising a plurality of microlenses and/or diffractive structures, the optical raster element being arranged in a second plane, the array and the optical raster element being configured to commonly produce a two-dimensional far field intensity distribution in the pupil surface, the pupil surface being different from both the first plane and the second plane;
    an optical integrator arranged in or in close proximity to the pupil surface, the optical integrator being configured to produce a plurality of secondary light sources; and
    an optical imaging system that optically conjugates the first plane to the second plane,
    wherein the illumination system is configured to illuminate a mask in a microlithography exposure apparatus.

2. The illumination system of claim 1, wherein the two-dimensional far field intensity distribution is a convolution of a far field intensity distribution produced by the array and a far field intensity distribution produced by the optical raster element.

3. The illumination system of claim 1, wherein the optical raster element comprises a plurality of zones, wherein each zone is, by optical conjugation produced by the optical imaging system, associated with at least one beam deflection element of the array, and wherein at least two zones produce different far field intensity distributions.

4. The illumination system of claim 3, wherein the at least two zones each produce a far field intensity distribution that has at least substantially the shape of a polygon having n corners, with n≠4.

5. The illumination system of claim 4, wherein the polygons have different angular orientations.

6. The illumination system of claim 3, wherein a first set of the plurality of zones produces a far field intensity distribution that is a first set of regular hexagons, and a different set of the plurality of zones produces a far field intensity distribution that is a second regular hexagons rotated by 30° relative to the first set of hexagons.

7. The illumination system of claim 1, wherein each beam deflection element is configured to be either in a first state or in a second state, a light beam deflected by a beam deflection element passes the pupil surface when the beam deflection element is in the first state, a light ray deflected by the beam deflection element does not pass through the pupil surface when the beam deflection element is in the second state.

8. The illumination system of claim 7, wherein the optical raster element comprises a plurality of zones, wherein each zone is, by optical conjugation produced by the optical imaging system, associated with at least one beam deflection element of the array, wherein at least two zones produce different far field intensity distributions, the far field intensity distributions produced by the plurality of zones is determined such that a usable area of the pupil surface is at least substantially illuminated if all beam deflection elements are in the first state.

9. The illumination system of claim 8, wherein the far field intensity distributions produced by the plurality of zones is determined such that at least 70% of the usable area of the pupil surface is illuminated if all beam deflection elements are in the first state.

10. The illumination system of claim 1, wherein the first plane is an object plane of the optical imaging system, and the second plane is an image plane of the optical imaging system.

11. The illumination system of claim 1, wherein the second plane is an object plane of the optical imaging system, and the first plane is an image plane of the optical imaging system.

12. The illumination system of claim 1, wherein the optical imaging system comprises an at least substantially plane folding mirror.

13. The illumination system of claim 1, further comprising a pupil forming condenser configured to establish a Fourier relationship between the image plane and the pupil surface.

14. The illumination system of claim 13, wherein the pupil forming condenser comprises a zoom optical system having a variable focal length.

15. The illumination system of claim 13, wherein the pupil forming condenser comprises an axicon system configured to radially redistribute light propagating therethrough.

16. The illumination system of claim 15, wherein the axicon system comprises a pair of axicon elements, each of the axicon elements having a conical optical surface and a drive mechanism configured to adjust a distance between the axicon elements along the optical axis.

17. The illumination system of claim 1, wherein the optical integrator is a fly's eye optical integrator.

18. The illumination system of claim 1, further comprising a field forming condenser configured to establish a Fourier relationship between the pupil surface and a field plane of the illumination system.

19. The illumination system of claim 18, further comprising a field stop arranged in the field plane of the illumination system.

20. The illumination system of claim 19, further comprising a field stop objective configured to image the field plane onto a mask plane.

21. The illumination system of claim 1, wherein the first plane is arranged obliquely with respect to the optical axis.

22. The illumination system claim 1, wherein the beam deflection elements are mirrors.

23. The illumination system of claim 22, wherein the mirrors are tiltable by two tilt axes forming an angle therebetween.

24. The illumination system of claim 23, wherein the angle is 90°.

25. The illumination system of claim 22, wherein the array comprises less than 100 individual mirrors.

26. The illumination system of claim 22, wherein the array comprises less than 50 individual mirrors.

27. The illumination system of claim 1, wherein the beam deflection elements are electro-optical or acousto-optical elements.

28. The illumination system of claim 1, further comprising an exchange holder that can exchangeably receives the optical raster element.

29. An apparatus, comprising:
an illumination system according to claim 1; and
a projection objective,
wherein the apparatus is a microlithography exposure apparatus.

30. The illumination system of claim 1, wherein the optical imaging system images the first plane on the second plane.

31. The illumination system of claim 1, wherein the optical imaging system images the second plane on the first plane.

* * * * *

UNITED STATES PATENT AND TRADEMARK OFFICE
CERTIFICATE OF CORRECTION

PATENT NO.         : 8,416,390 B2
APPLICATION NO.    : 12/533756
DATED              : April 9, 2013
INVENTOR(S)        : Markus Deguenther et al.

It is certified that error appears in the above-identified patent and that said Letters Patent is hereby corrected as shown below:

Title Page, Column 1, Related U.S. Application Data, insert Item (63)
--(63) Continuation of application No. PCT/EP2008/003369, filed on Apr. 25, 2008.--;

In the Specification

Column 12, Line 45, delete "isoscales" insert --isosceles--;

Column 12, Line 45, delete "triangles" insert --triangles,--;

In the Claims

Column 20, Line 9, Claim 22, delete "system" insert --system of--.

Signed and Sealed this
Tenth Day of December, 2013

Margaret A. Focarino
*Commissioner for Patents of the United States Patent and Trademark Office*